(12) United States Patent
Amo

(10) Patent No.: US 11,563,111 B2
(45) Date of Patent: Jan. 24, 2023

(54) METHOD OF MANUFACTURING SEMICONDUCTOR DEVICE HAVING SPLIT-GATE MEMORY AND MISFET

(71) Applicant: RENESAS ELECTRONICS CORPORATION, Tokyo (JP)

(72) Inventor: Atsushi Amo, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 114 days.

(21) Appl. No.: 16/928,854

(22) Filed: Jul. 14, 2020

(65) Prior Publication Data
US 2021/0036132 A1    Feb. 4, 2021

(30) Foreign Application Priority Data

Aug. 1, 2019    (JP) .............................. JP2019-142282

(51) Int. Cl.
*H01L 29/66*    (2006.01)
*H01L 21/28*    (2006.01)

(52) U.S. Cl.
CPC .. *H01L 29/66833* (2013.01); *H01L 29/40117* (2019.08); *H01L 29/66484* (2013.01)

(58) Field of Classification Search
CPC ......... H01L 29/66833; H01L 29/66484; H01L 27/11573; H01L 29/42344; H01L 27/11568; H01L 29/792
See application file for complete search history.

(56) References Cited

U.S. PATENT DOCUMENTS

| | | | |
|---|---|---|---|
| 9,318,500 B2 | 4/2016 | Shinohara | |
| 2016/0064397 A1* | 3/2016 | Hayashi | H01L 29/40117 438/275 |
| 2016/0293620 A1* | 10/2016 | Ogata | H01L 29/40117 |
| 2017/0358592 A1* | 12/2017 | Yamaguchi | H01L 29/0847 |
| 2018/0061849 A1* | 3/2018 | Yamaguchi | H01L 21/76802 |
| 2018/0090365 A1* | 3/2018 | Kamoshima | H01L 21/76837 |
| 2018/0151614 A1* | 5/2018 | Endo | H01L 27/14614 |

FOREIGN PATENT DOCUMENTS

JP    2014-154789 A    8/2014

* cited by examiner

*Primary Examiner* — Wasiul Haider
(74) *Attorney, Agent, or Firm* — McDermott Will & Emery LLP

(57) ABSTRACT

A trench is formed by removing a portion of each of the charge accumulation film and the insulating film located between the control gate electrode and the memory gate electrode. The insulating film is formed in the trench so that the upper surface of each of the insulating film and the charge accumulation film is covered with the insulating film. When exposing the upper surface of the control gate electrode and the memory gate electrode, the upper surface of each of the insulating film and the charge accumulation film is not exposed.

10 Claims, 30 Drawing Sheets

FIG. 26

| Applied Voltage / Operation | Vd | Vog | Vmg | Vs | Vb |
|---|---|---|---|---|---|
| Write | 0.3 V | 1 V | 6 V | 4 V | 0 V |
| Erase | 0 V | 0 V | −4 V | 4 V | 0 V |
| Read | 1 V | 1 V | 0 V | 0 V | 0 V |

METHOD OF MANUFACTURING SEMICONDUCTOR DEVICE HAVING SPLIT-GATE MEMORY AND MISFET

CROSS-REFERENCE TO RELATED APPLICATIONS

The disclosure of Japanese Patent Application No. 2019-142282 filed on Aug. 1, 2019 including the specification, drawings and abstract is incorporated herein by reference in its entirety.

BACKGROUND

The present invention relates to methods for manufacturing a semiconductor device, and more particularly, the present invention relates to a technique which can be applied to methods for manufacturing a semiconductor device having a split-gate type flash memory.

As a semiconductor device having a non-volatile memory capable of writing and erasing electrically, a semiconductor device having a split-gate type flash memory is known. The flash memory has a control gate electrode, a memory gate electrode, and a charge accumulation film formed below the memory gate electrode so as to be sandwiched between oxide films. The charge accumulation film is formed between the memory gate electrode and a semiconductor substrate, and between the memory gate electrode and the control gate electrode. As the charge accumulation film, a high dielectric constant insulating film having the dielectric constant higher than a silicon nitride film is used. The writing and erasing of the flash memory are performed by injecting charges into the charge accumulation film or by extracting charges from the charge accumulation film. The flash memory is introduced into one semiconductor chip together with MISFET used in logic circuits or I/O circuits or the like.

There are disclosed techniques listed below.
[Patent Document 1] Japanese Unexamined Patent Application Publication No. 2014-154789

Patent Document 1 discloses a technique for forming a split-gate flash memory with a charge accumulation film having the dielectric constant higher than a silicon nitride film and a MISFET with a metal gate electrode on a semiconductor substrate.

The above-described Patent Document 1 discloses a process of forming a metal gate electrode of a MISFET by exposing an upper surface of each of the control gate electrode and the memory gate electrode of the flash memory covered with an insulating film and an upper surface of a dummy gate comprising polysilicon of MISFET by CMP, then removing the dummy gate to form a trench, and embedding metal into the trench.

SUMMARY

However, in the above-described process of Patent Document 1, a portion of the charge accumulation film located between the control gate electrode and the memory gate electrode of the flash memory is polished during CMP which exposes an upper surface of each of the control gate electrode and the memory gate electrode. When the charge accumulation film is a high dielectric constant insulating film comprising a metal such as hafnium, the metal contained in the charge accumulation film may diffuse by polishing and adhere to a semiconductor substrate. When the diffused metal adheres to the gate insulating film of MISFET, the threshold of MISFET varies, hence causing a concern that the desired electrical properties are not obtained. Also, when ion implantation is performed to form a source region and a drain region of a flash memory or MISFET and the like, in the state where this metal is attached to the surface of a semiconductor substrate, the metal diffuses into the semiconductor substrate. The metal as diffused in the semiconductor substrate causes an increase in a junction leakage current, and thus, there is a concern that an electrical reliability of semiconductor device may be reduced.

Other objects and novel features will become apparent from the description and drawings of this specification.

A method for manufacturing semiconductor device according to an embodiment comprises: forming a control gate electrode on a semiconductor substrate; forming a memory gate electrode on a side surface of the control gate electrode through a charge accumulation film comprising a metal; forming a trench having a bottom surface at a position lower than an upper surface of the control gate electrode and the memory gate electrode by removing a part of the charge accumulation film located between the control gate electrode and the memory gate electrode; embedding the inside of the trench with an insulating film different from the charge accumulation film; and polishing so as to expose an upper surface of the control gate electrode and the memory gate electrode after embedding the insulating film in the trench.

According to the embodiment, it is possible to improve a reliability of a semiconductor device.

BRIEF DESCRIPTION OF THE DRAWINGS

FIG. 26 is a table showing an example of voltages applied to respective portions of a selected memory cell at the time of writing, erasing, and reading.

DETAILED DESCRIPTION

Figure 1:
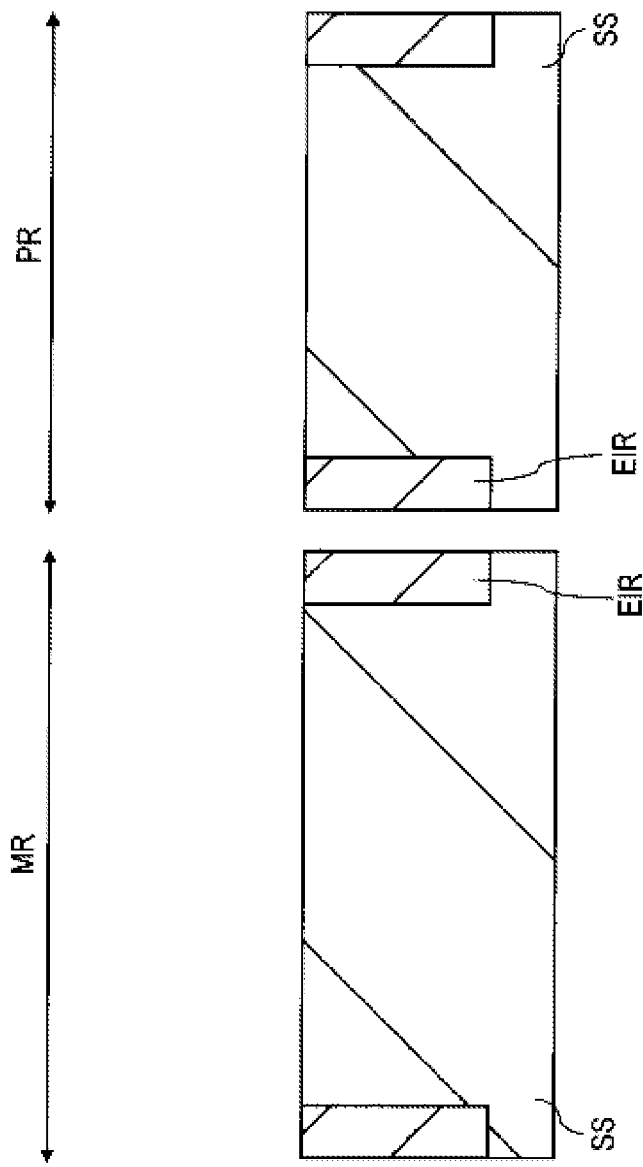
FIG. 1 shows a cross-sectional view of a main portion during the manufacturing process of a semiconductor device according to a first embodiment.

Hereinafter, a semiconductor device according to an embodiment will be described in detail by referring to the drawings. In the specification and the drawings, the same reference numerals are assigned to components having the same functions, and a repetitive description thereof is omitted. In addition, hatching in the drawings may be omitted in order to make the configuration easier to understand.

First Embodiment

Method for Manufacturing a Semiconductor Device

FIGS. 1 to 25 are cross-sectional views of a main portion of method for manufacturing a semiconductor device according to the present embodiment. FIGS. 1 to 25 show cross-sectional views of a main portion of a semiconductor device in a memory cell region MR and a peripheral region PR. In the present embodiment, an n-channel memory cell and a MISFET are formed, but a p-channel memory cell and a MISFET may be formed. A plurality of memory cells are formed on a semiconductor substrate SS, but FIGS. 1 to 25 show the manufacturing process when one memory cell is formed.

The semiconductor substrate SS has the memory cell region MR and the peripheral region PR. The memory cell region MR is a region in which a memory cell of a flash memory is formed. Further, the peripheral region PR is a region where MISFET constituting a peripheral circuit of the so-called memory cell is formed.

The semiconductor substrate SS is prepared as shown in FIG. 1. The semiconductor substrate SS comprises a p-type single-crystalline silicon with resistivity of, for example, about 1-10 Ωcm.

Next, an element isolation region EIR defining an active region in which active elements are to be formed is formed in the semiconductor substrate SS. The active region is a region in which active elements such as a memory cell and a MISFET of a flash memory are formed. The element isolation region EIR is formed by using, for example, a known STI (Shallow Trench Isolation) technique.

Next, in the memory cell region MR and the peripheral region PR, a p-type well is formed in the semiconductor substrate SS. The p-type well is formed by ion-implanting boron (B) into the semiconductor substrate SS. The p-type well is formed at a predetermined depth from the main surface of the semiconductor substrate SS toward the back surface opposite to the main surface. Note that illustration of the p-type well is omitted.

Figure 2:
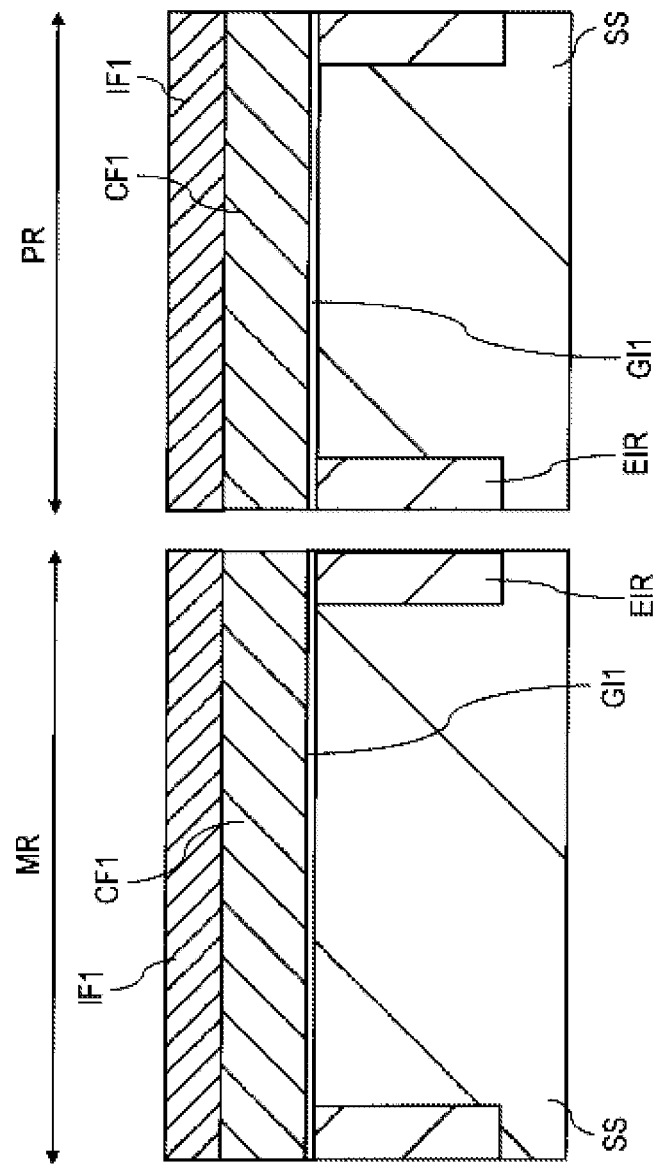
FIG. 2 is a cross-sectional view of a main portion during the manufacturing process of a semiconductor device following FIG. 1.

Next, as shown in FIG. 2, an insulating film GI1 is formed on the semiconductor substrate SS. The insulating film GI1 is, for example, a silicon oxide film. The insulating film GI1 is formed by a thermal oxidization method. The insulating film GI1 is an insulating film for a gate insulating film CGI of a control gate electrode CG to be described later.

Next, a conductive film CF1 is formed on the semiconductor substrate SS. The conductive film CF1 is formed through the insulating film GI1 on the semiconductor substrate SS. The conductive film CF1 is a polysilicon film. The conductive film CF1 is formed by a CVD (Chemical Vaper Deposition) method. The conductive film CF1 is a conductive film for a control gate electrode CG to be described later. Further, in order to reduce the resistance of the control gate electrode CG, impurities may be introduced into the conductive film CF1.

Next, an insulating film IF1 is formed on the conductive film CF1. The insulating film IF1 is a silicon oxide film, a silicon nitride film or a laminated film thereof. The insulating film IF1 is formed by a CVD method. The insulating film IF1 is an insulating film for a cap-insulating film CP1 to be described later.

Figure 3:
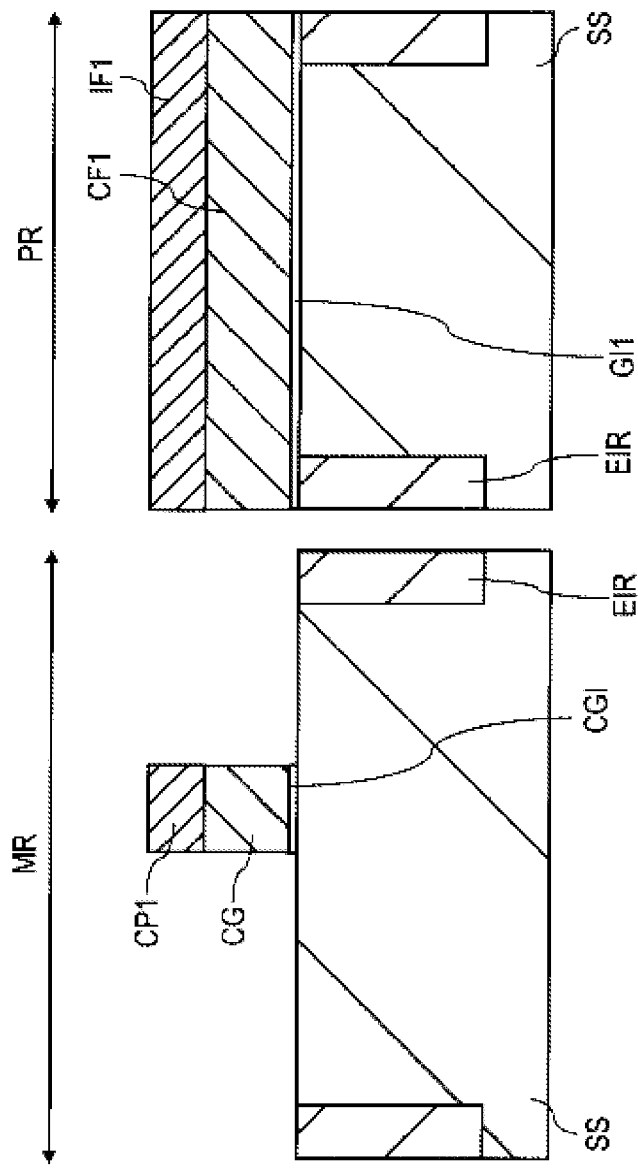
FIG. 3 is a cross-sectional view of a main portion during the manufacturing process of a semiconductor device following FIG. 2.

Next, as shown in FIG. 3, a gate insulating film CGI, a control gate electrode CG, and a cap-insulating film CP1 are formed on the semiconductor substrate SS. The gate insulating film CGI, the control gate electrode CG and the cap-insulating film CP1 are formed, for example, by patterning the gate insulating film CGI, the conductive film CF1 and the insulating film IF1 using known photolithography and etching techniques. The insulating film IF1, the conductive film CF1, and the insulating film GI1 formed in the peripheral region PR are not removed and remain.

Figure 4:
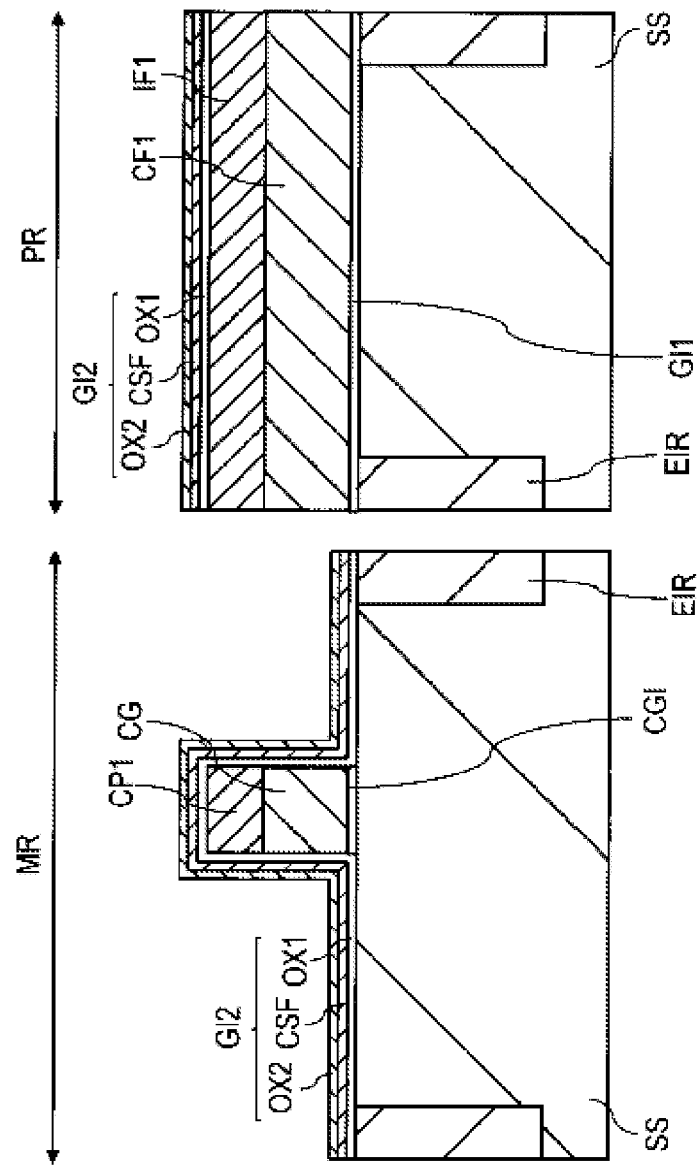
FIG. 4 is a cross-sectional view of a main portion during the manufacturing process of a semiconductor device following FIG. 3.

Next, as shown in FIG. 4, an insulating film GI2 is formed on the semiconductor substrate SS. The insulating film GI2 is a laminated film consisting of an insulating film OX1, a charge accumulation film CSF, and an insulating film OX2 in this order from the bottom. The insulating film GI2 is formed on the side surface of the control gate electrode CG, and on the side surface and the upper surface of the cap-insulating film CP1 in the memory cell region MR. In other words, the insulating film GI2 is formed on the semiconductor substrate SS so as to cover the laminated body consisting of the control gate electrode CG and the cap-insulating film CP1. On the other hand, in the peripheral region PR, the insulating film GI2 is formed on the insulating film IF1. The insulating film GI2 is an insulating film for a gate insulating film MGI to be described later.

Hereinafter, a method of forming the insulating film GI2 will be described. First, the insulating film OX1 is formed on the semiconductor substrate SS. The insulating film OX1 is a silicon oxide film. The insulating film OX1 is formed by an ISSG (In Situ Steam Generation) oxidation method, a thermal oxidation method, or a CVD method.

Next, the charge accumulation film CSF is formed on the insulating film OX1. The charge accumulation film CSF is a high dielectric constant insulating film having the dielectric constant higher than a silicon nitride film, and is a film comprising a metal different from a silicon. The charge accumulation film CSF is a film comprising hafnium and oxygen, and is, for example, a hafnium oxide film or a hafnium silicate film. The charge accumulation film CSF is formed by, for example, a LPCVD (Low Pressure CVD) method or an ALD (Atomic Layer Deposition) method.

Next, the insulating film OX2 is formed on the charge accumulation film CSF. The insulating film OX2 is a high dielectric constant insulating film having the dielectric constant higher than a silicon nitride film, and is a film comprising a metal different from a silicon. The insulating film OX2 is a film comprising aluminum (Al), titanium (Ti), zirconium (Zr), yttrium (Y), lanthanum (La), praseodymium (Pr), or lutetium (Lu). The insulating film OX2 is formed by, for example, a LPCVD method or an ALD method. As described above, the insulating film GI2 is formed on the semiconductor substrate SS.

Figure 5:
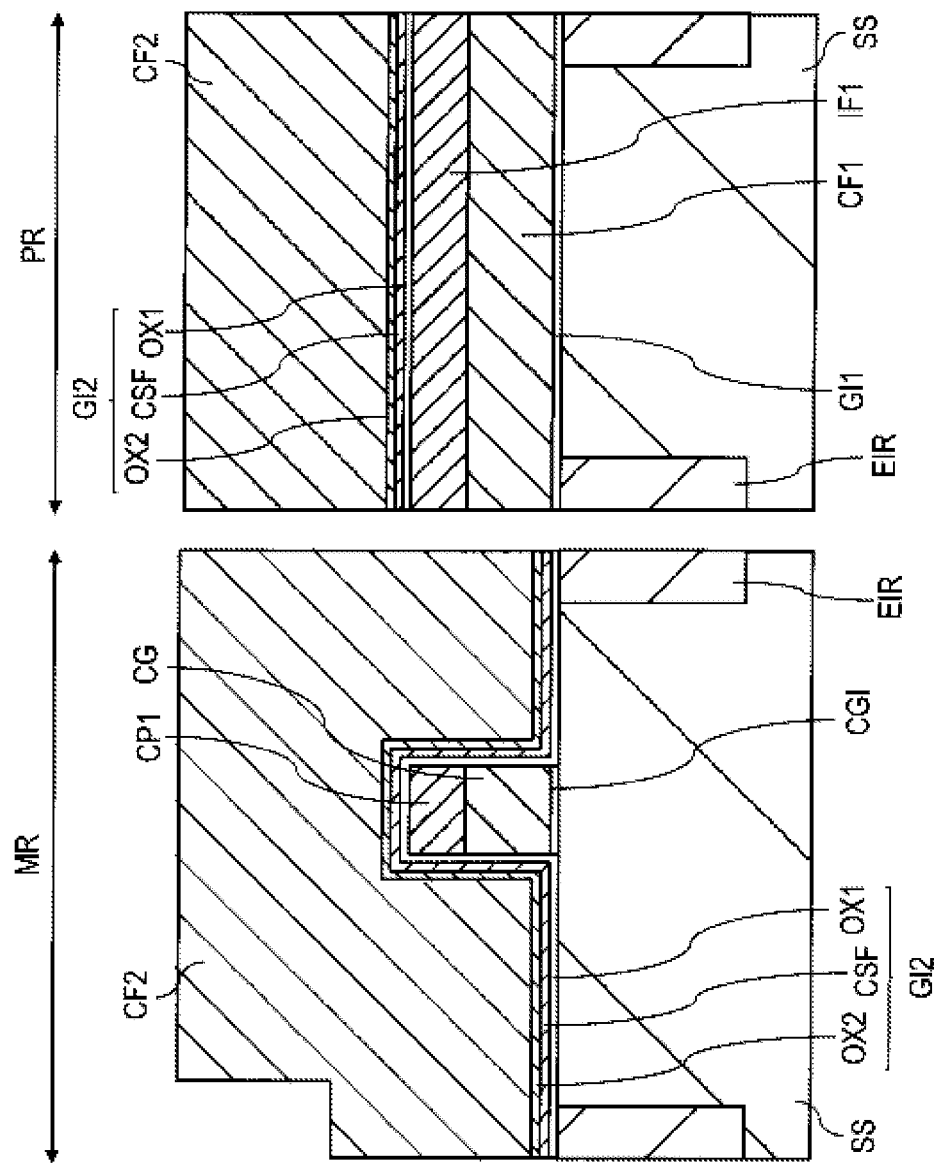
FIG. 5 is a cross-sectional view of a main portion during the manufacturing process of a semiconductor device following FIG. 4.

Next, a conductive film CF2 is formed on the semiconductor substrate SS as shown in FIG. 5. The conductive film CF2 is formed on the semiconductor substrate SS so as to cover the control gate electrode CG and the cap-insulating film CP1 in the memory cell region MR. In other words, the conductive film CF2 is formed on the semiconductor substrate SS and on the side surface of the control gate-electrode CG through the insulating film GI2. In the peripheral region PR, the conductive film CF2 is formed on the insulating film GI2. Methods and materials for forming the conductive film CF2 are the same as those for the conductive film CF1.

Figure 6:
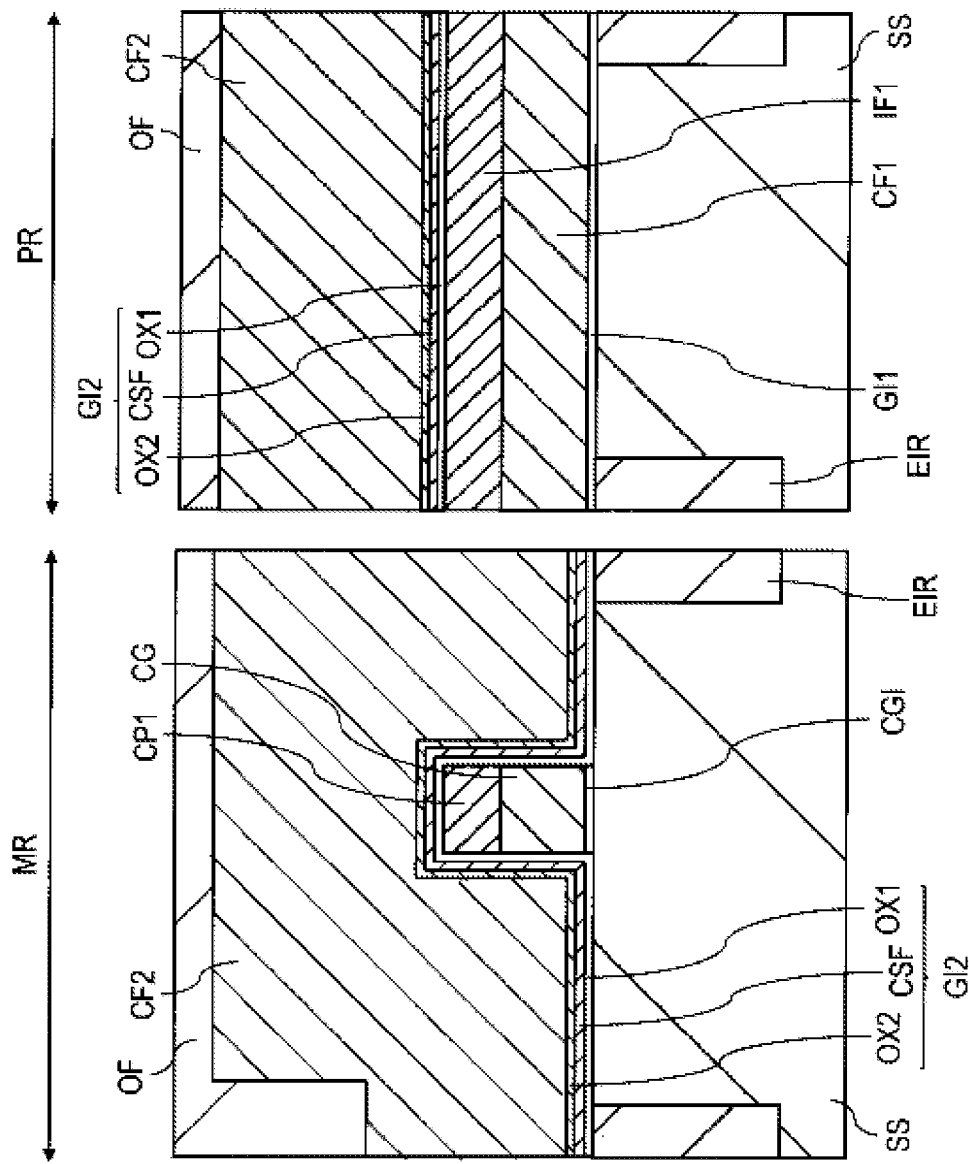
FIG. 6 is a cross-sectional view of a main portion during the manufacturing process of a semiconductor device following FIG. 5.

Next, as shown in FIG. 6, an organic film OF1 is formed on the conductive film CF2. Since the organic film OF1 is a film having fluidity at the time of coating, when the organic film OF1 is formed on the conductive film CF2, the organic film OF1 is formed so as to fill the region where the upper surface of the conductive film CF2 is low. As shown in FIG. 6, after the organic film OF1 is formed, an upper surface of the organic film OF1 is substantially flat. Thereafter, a heat treatment is performed on the organic film OF1 to cure the organic film OF1.

Figure 7:
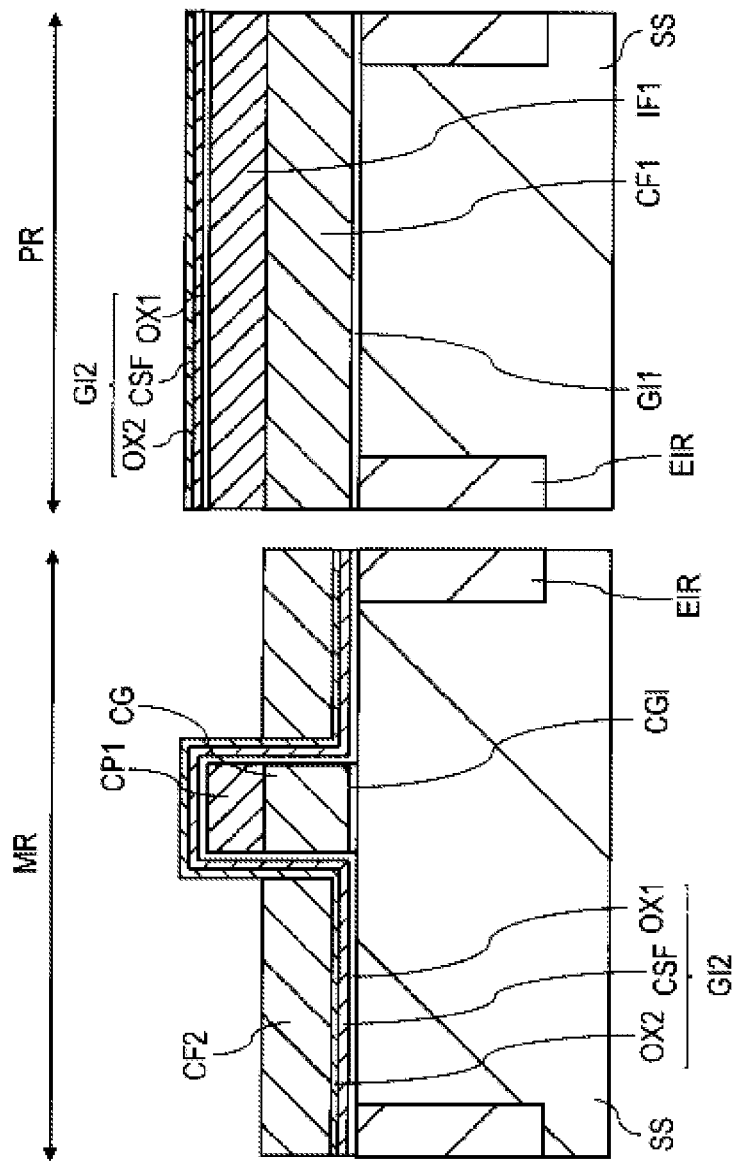
FIG. 7 is a cross-sectional view of a main portion during the manufacturing process of a semiconductor device following FIG. 6.

Next, as shown in FIG. 7, the laminated film consisting of the organic film OF1 and the conductive film CF2 is etched, thereby causing an upper surface of the conductive film CF2 to recede. The speed at which the organic film OF1 is etched and the speed at which the conductive film CF2 is etched are equivalent to each other. As shown in FIG. 7, an upper surface of the conductive film CF2 retracted by the etching is approximately flat. An upper surface of the conductive film CF2 is approximately the same height as an upper surface of the control gate electrode CG. In the peripheral region PR, the conductive film CF2 is removed.

Figure 8:
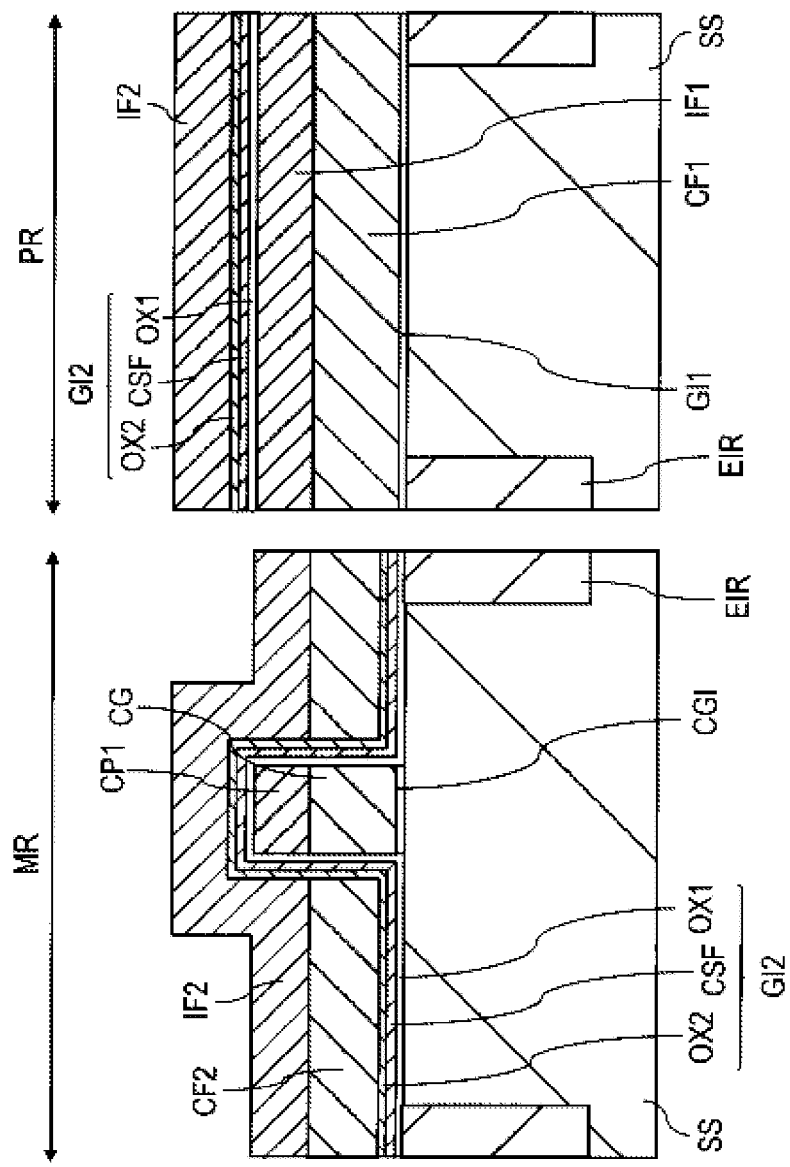
FIG. 8 is a cross-sectional view of a main portion during the manufacturing process of a semiconductor device following FIG. 7.

Next, as shown in FIG. 8, the insulating film IF2 is formed on the conductive film CF2 and the insulating film GI2. The insulating film IF2 is, for example, a silicon nitride film. The insulating film IF2 is formed using a CVD method. In the memory cell region MR, the insulating film IF2 is formed so as to cover the cap-insulating film CP1. In the peripheral region PR, the insulating film IF2 is formed on the insulating film GI2.

Figure 9:
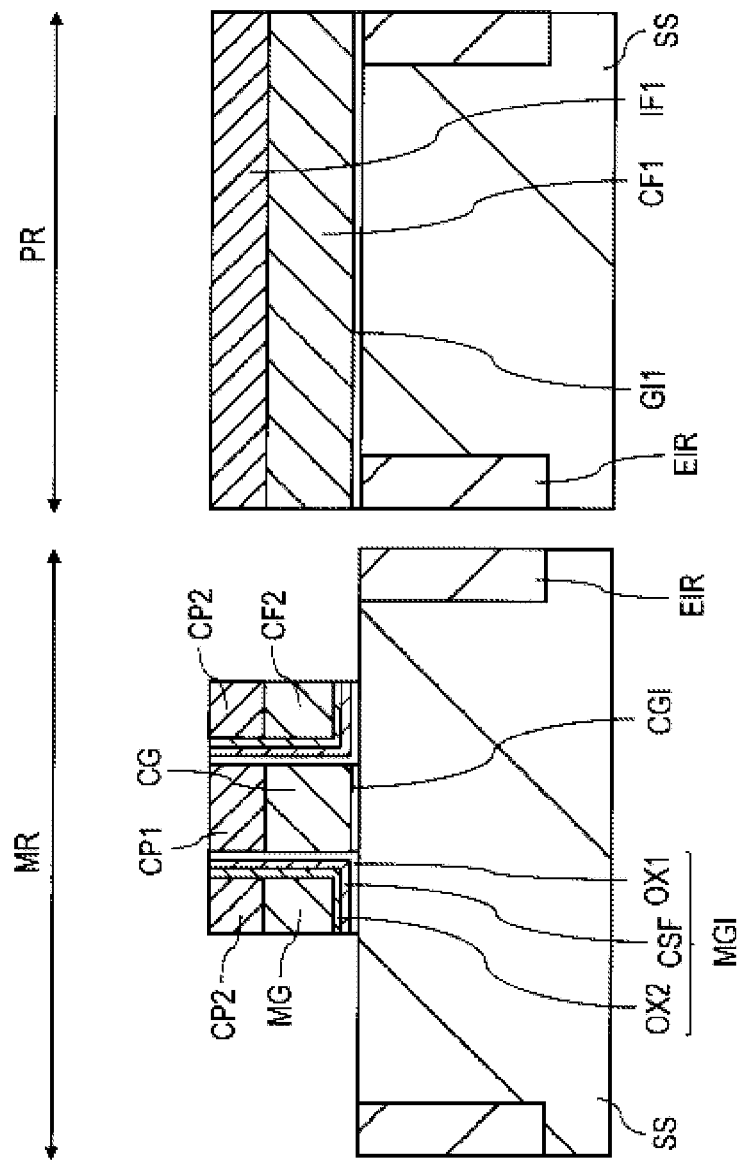
FIG. 9 is a cross-sectional view of a main portion during the manufacturing process of a semiconductor device following FIG. 8.

Next, as shown in FIG. 9, upon forming the cap-insulating film CP2, the conductive film CF2 and the insulating film GI2 are patterned. By providing an anisotropic etching to the insulating film IF2, the conductive film CF2 and the insulating film GI2, the cap-insulating film CP2 is formed, and the conductive film CF2 and the insulating film GI2 are patterned. Of the conductive film CF2 left on both side surfaces of the control gate electrode CG, one is a memory gate electrode MG of the memory cell and the other is removed later. Of the insulating film GI2 left on both side surfaces of the control gate electrode CG, one is a gate insulating film MGI, the other is removed later.

Figure 10:
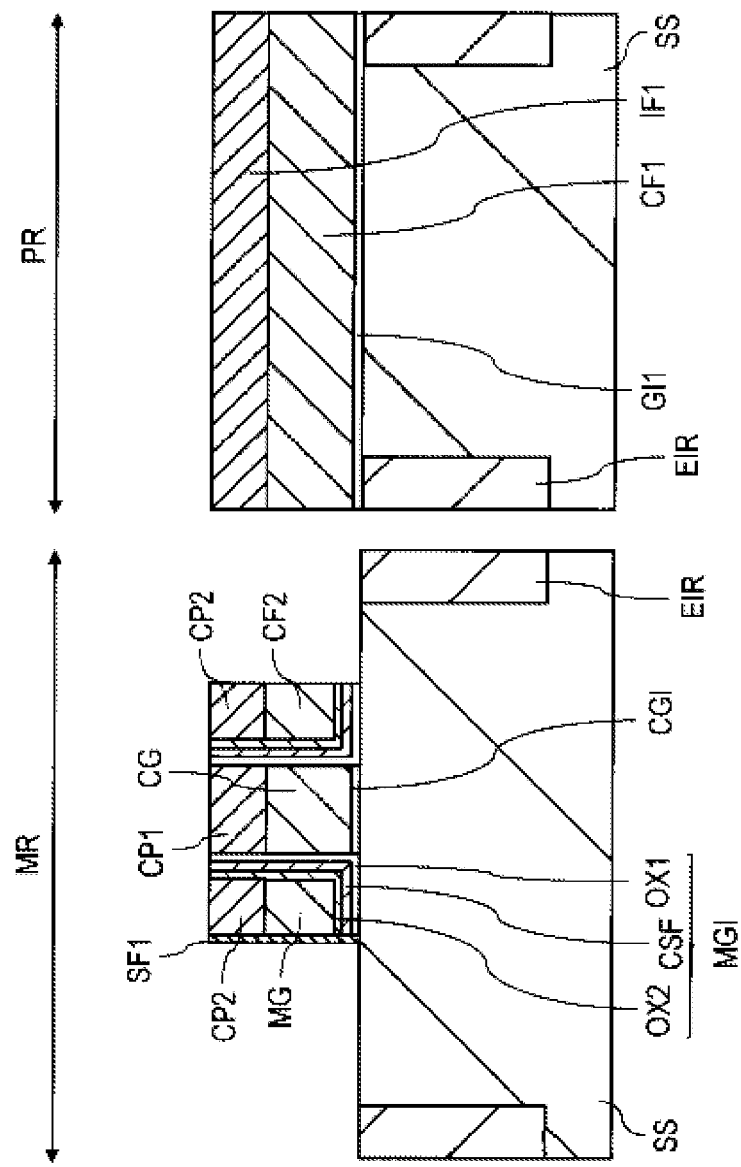
FIG. 10 is a cross-sectional view of a main portion during the manufacturing process of a semiconductor device following FIG. 9.

Next, as shown in FIG. 10, on the side surface of the memory gate electrode MG, a spacer film SF1 is formed. A silicon nitride film is formed so as to cover the control gate electrode CG, the memory gate electrode MG, the conductive film CF2, the cap-insulating film CP2, the insulating film GI2 and the gate insulating film MGI. The silicon nitride film is formed by, for example, a CVD method. Next, by providing an anisotropic etching to the silicon nitride film, the silicon nitride film is left on the side surface of the memory gate electrode MG and on the side surface of the conductive film CF2. Thereafter, the silicon nitride film left on the side surface of the conductive film CF2 is exposed, and, while a resist film covering the silicon nitride film left on the side surface of the memory gate electrode MG is formed, the silicon nitride film on the side surface of the conductive film CF2 is removed by etching the silicon nitride film. Thus, on the side surface of the memory gate electrode MG, the spacer film SF1 comprising a silicon nitride film is formed.

Since a plurality of memory cells are formed on the semiconductor substrate SS, a plurality of control gate electrodes CG are formed on the semiconductor substrate SS. In the process shown in FIG. 9, the region between the control gate electrode CG adjacent to each other without passing through the memory gate electrode MG may be embedded by the conductive film CF2. In this case, the silicon nitride film formed so as to cover the control gate electrode CG, the memory gate electrode MG, the conductive film CF2, the cap-insulating film CP2, the insulating film GI2 and the gate insulating film MGI is not formed on the side surface of the conductive film CF2. Therefore, by applying an anisotropic etching to the silicon nitride film, the spacer film SF1 comprising a silicon nitride film is formed on the side surface of the memory gate electrode MG.

The spacer film SF1 is in contact with the side surface of the memory gate electrode MG, the side surface of the cap-insulating film CP2, and the side surface of the gate insulating film MGI. The spacer film SF1 is formed so as to cover the side surface of the insulating film OX2, the side surface of the charge accumulation film and the side surface of the insulating film OX1 located between the memory gate electrode MG and the semiconductor substrate SS. On the other hand, the spacer film SF1 is not formed on the side surface of the conductive film CF2. First, a silicon nitride film is formed so as to cover the control gate electrode CG and the memory gate electrode MG. Thereafter, by providing an anisotropic etching to the silicon nitride film, the spacer film SF1 is formed. The thickness of the spacer film SF1 is, for example, 5 nm.

Figure 11:
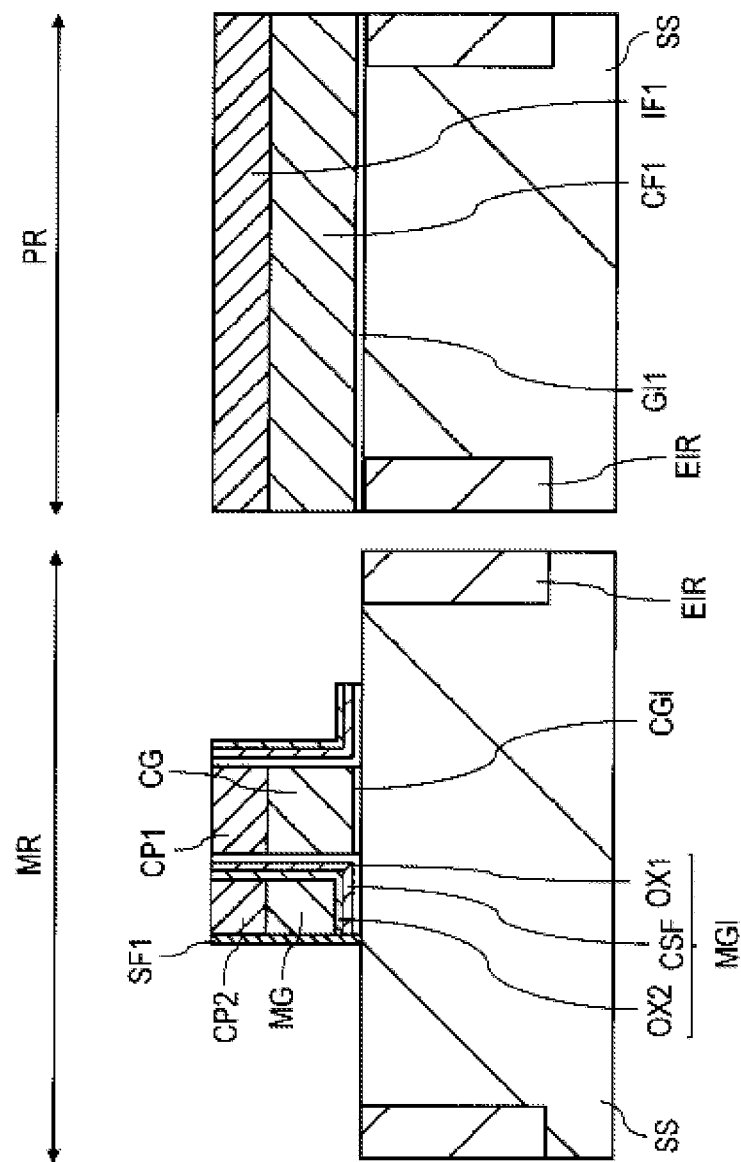
FIG. 11 is a cross-sectional view of a main portion during the manufacturing process of a semiconductor device following FIG. 10.

Next, as shown in FIG. 11, the conductive film CF2 that is not used as the memory gate electrode MG, and a cap-insulating film CP2 formed on the conductive film CF2 are removed. The conductive film CF2 and the cap-insulating film CP2 are removed by etching. The insulating film GI2 located below the conductive film CF2 is not removed and remains. On the main surface of the semiconductor substrate SS, a gate structure of a nonvolatile memory having the control gate electrode CG formed through the gate insulating film CGI, a memory gate electrode MG disposed on the side portion of the control gate electrode CG, and the charge accumulation film CSF disposed between the control gate electrode CG and the memory gate electrode MG and below the memory gate electrode MG is formed.

Figure 12:
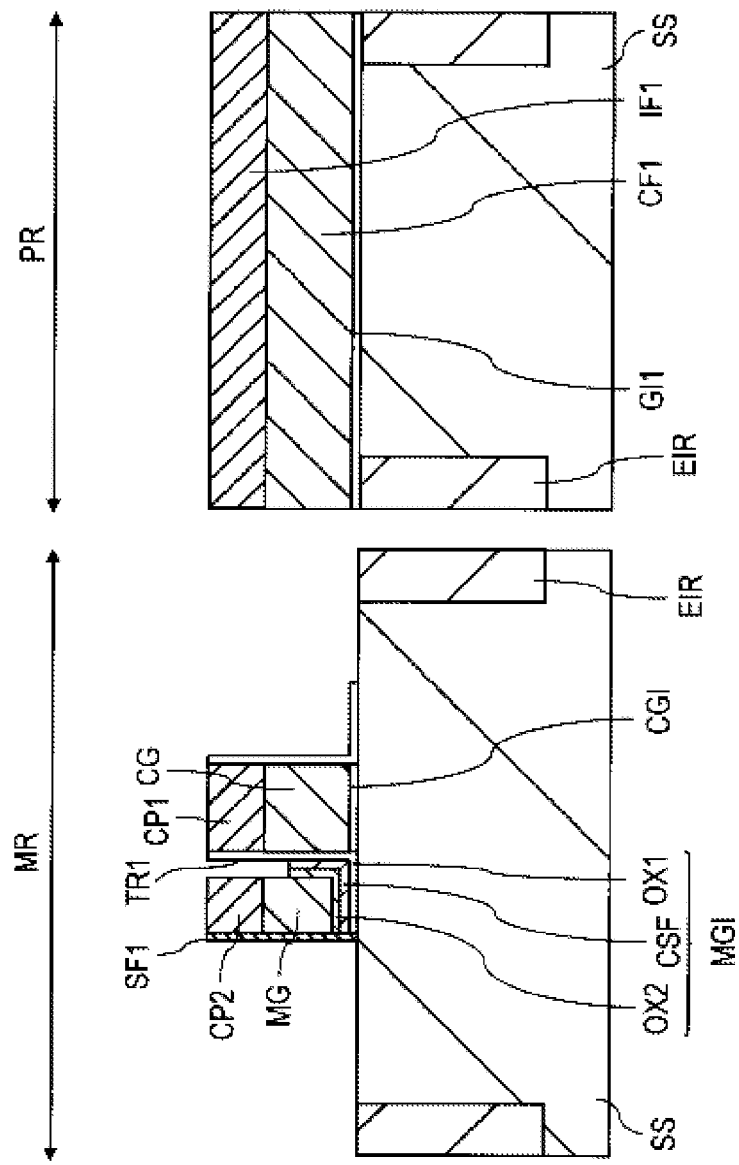
FIG. 12 is a cross-sectional view of a main portion during the manufacturing process of a semiconductor device following FIG. 11.

Next, as shown in FIG. 12, a part of each of the insulating film OX2 and the charge accumulation film CSF is removed by an isotropic etching. The isotropic etching is performed under the condition that the speed at which the insulating film OX2 and the charge accumulation film CSF are etched is faster than the speed at which the insulating film OX1 is etched. As the isotropic etching, an ALE (Atomic Layer Etching) method can be used.

Each of the insulating film OX2 and the charge accumulation film CSF located between the control gate electrode CG and the memory gate electrode MG is partially removed, but is not completely removed. After the etching is performed, the upper surface of each of the insulating film OX2 and the charge accumulation film CSF located between the control gate electrode CG and the memory gate electrode MG is lower than the respective upper surface of the insulating film OX1, the control gate electrode CG and the memory gate electrode MG. Thus, a trench TR1 is formed between the control gate electrode CG and the memory gate electrode MG. The bottom surface of the trench TR1 is an upper surface of each of the insulating film OX2 and the charge accumulation film CSF. One of the two side surfaces of the trench TR1 is the side surface of the insulating film OX1, and the other is a part of the side surface of the cap-insulating film CP2 and the side surface of the memory gate electrode MG. The insulating film OX2 and the charge accumulation film CSF formed on the opposite side of the memory gate electrode MG of the control gate electrode CG are removed. The insulating film OX2 and the charge accumulation film CSF located between the memory gate electrode MG and the semiconductor substrate SS are not removed by etching because they are covered by the spacer film SF1.

Figure 13:
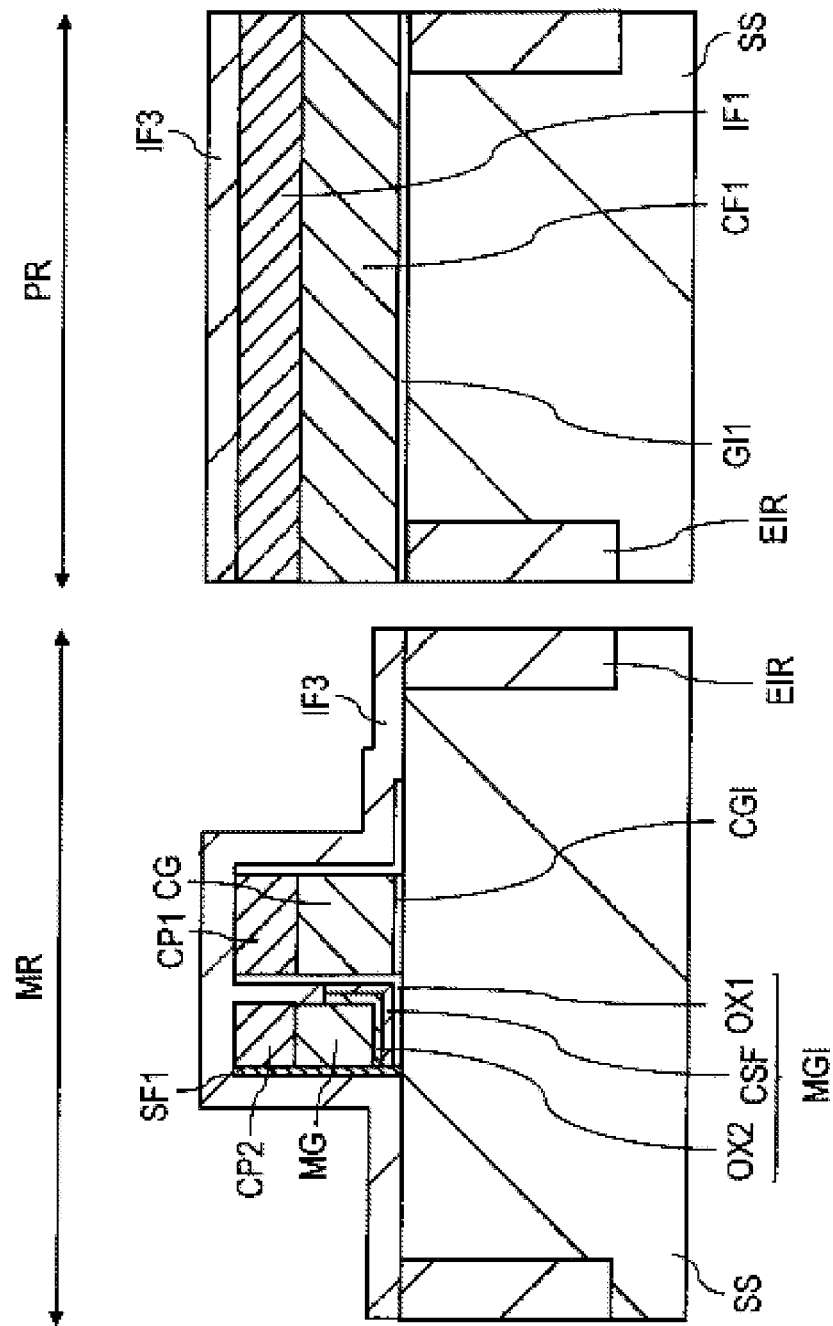
FIG. 13 is a cross-sectional view of a main portion during the manufacturing process of a semiconductor device following FIG. 12.

Next, as shown in FIG. 13, an insulating film IF3 that is a protective film is formed on the semiconductor substrate SS so as to cover the control gate electrode CG and the memory gate electrode MG. The insulating film IF3 is a silicon oxide film. The insulating film IF3 is formed by a CVD method. In the trench TR1, the insulating film IF3 may be formed to the extent it covers the upper surface of each of the charge accumulation film CSF and the insulating film OX2. The insulating film IF3 is preferably formed to fill the trench TR1. In order to fill the trench TR1 with the insulating film IF3, a thickness of the insulating film IF3 is preferably at least ½ or more of the width of the trench TR1. By forming the insulating film IF3 in the trench TR1, the respective upper surface of the insulating film OX2 and the charge accumulation film CSF located between the control gate electrode CG and the memory gate electrode MG is covered by the insulating film IF3. In the following step, each upper surface of the charge accumulation film CSF and the insulating film OX2 is covered with the insulating film IF3.

Figure 14:
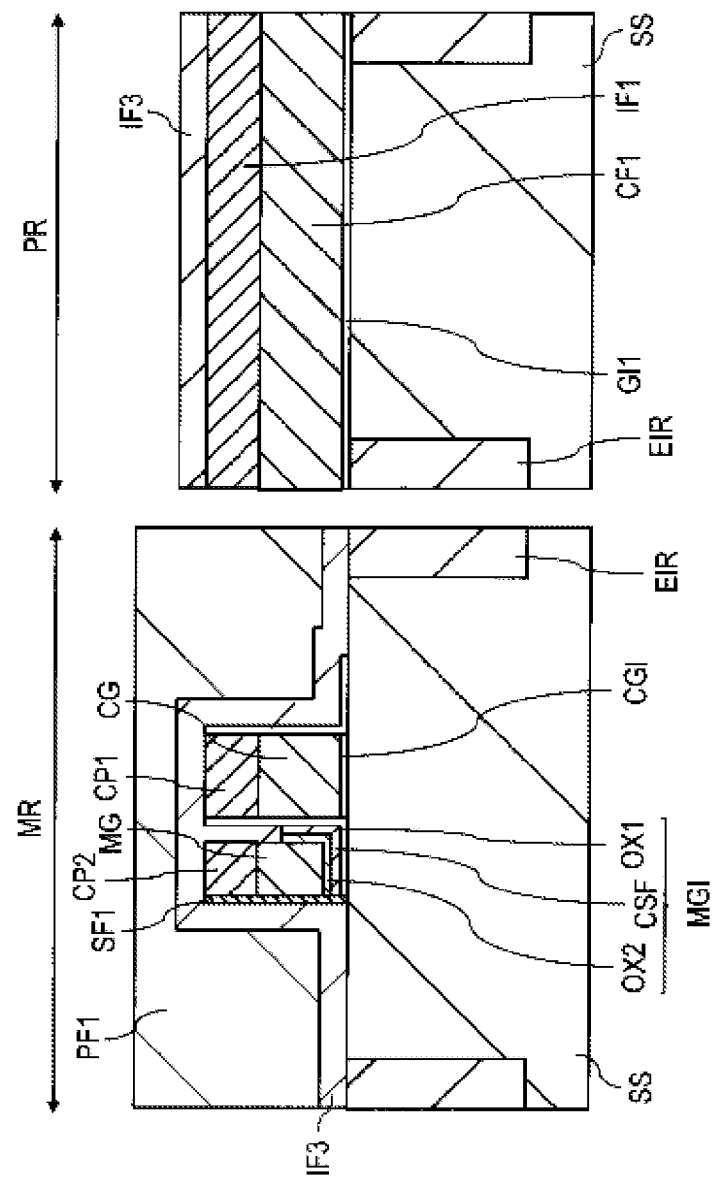
FIG. 14 is a cross-sectional view of a main portion during the manufacturing process of a semiconductor device following FIG. 13.

Next, as shown in FIG. 14, a protective film PF1 is formed on the semiconductor substrate SS so as to cover the control gate electrode CG and the memory gate electrode MG formed in the memory cell region MR. The protective film PF1 is, for example, a polycrystalline silicon film, a silicon oxide film, or the like. The protective film PF1 is formed by a CVD (Chemical Vapor Deposition) method.

Figure 15:
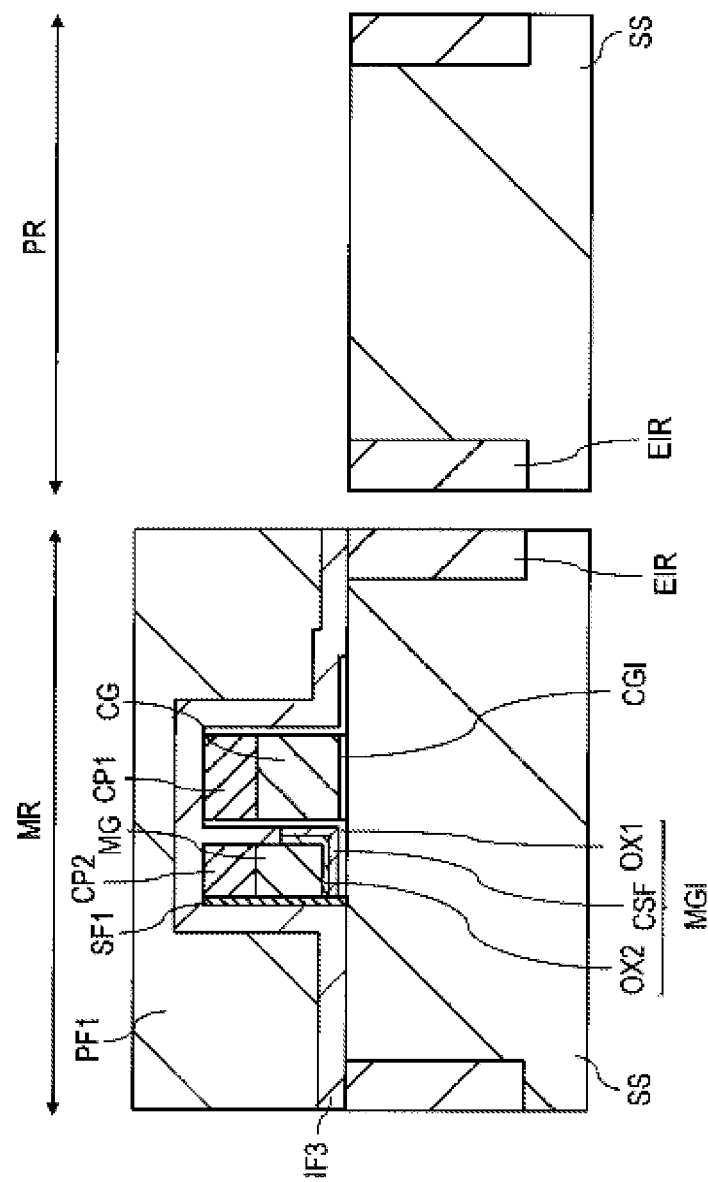
FIG. 15 is a cross-sectional view of a main portion during the manufacturing process of a semiconductor device following FIG. 14.

Next, as shown in FIG. 15, the insulating film GI1, the conductive film GF1 and the insulating film IF1 formed in the peripheral region PR are removed. The insulating film GI1, the conductive film CF1 and the insulating film IF1 are removed by an isotropic etching. By removing the insulating film GI1, the main surface of the semiconductor substrate SS is exposed in the peripheral region PR.

Figure 16:
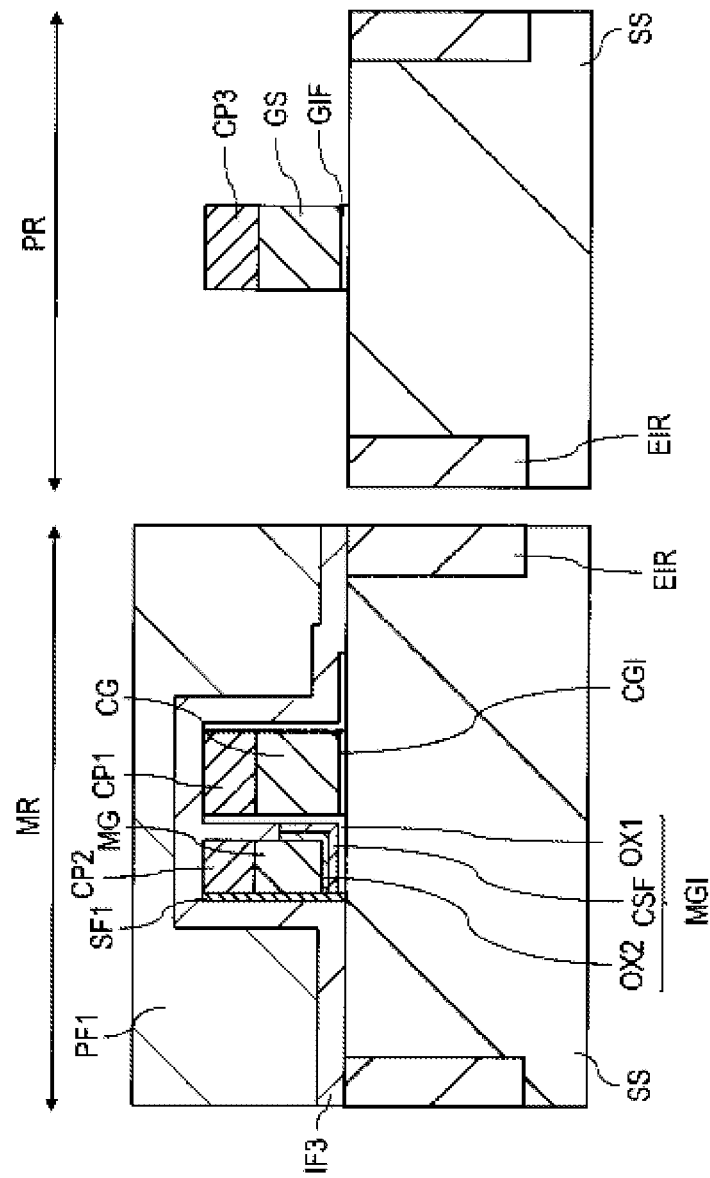
FIG. 16 is a cross-sectional view of a main portion during the manufacturing process of a semiconductor device following FIG. 15.

Next, as shown in FIG. 16, a gate insulating film GIF, a gate structure GS, and a cap-insulating film CP3 are formed on the semiconductor substrate SS in the peripheral region PR. The method of forming these is similar to the method of forming the gate insulating film CG1, the control gate electrode CG and the cap-insulating film CP1. The gate insulating film GIF is a laminated film of the silicon oxide film formed on the semiconductor substrate SS and the insulating film formed on the silicon oxide film. The insulating film on the silicon oxide film is a high dielectric constant insulating film having the dielectric constant higher than a silicon nitride film. The gate structure GS is formed through the gate insulating film GIF. Since the gate structure GS is removed when forming the gate electrode GE, it is often referred to as a dummy gate.

Figure 17:
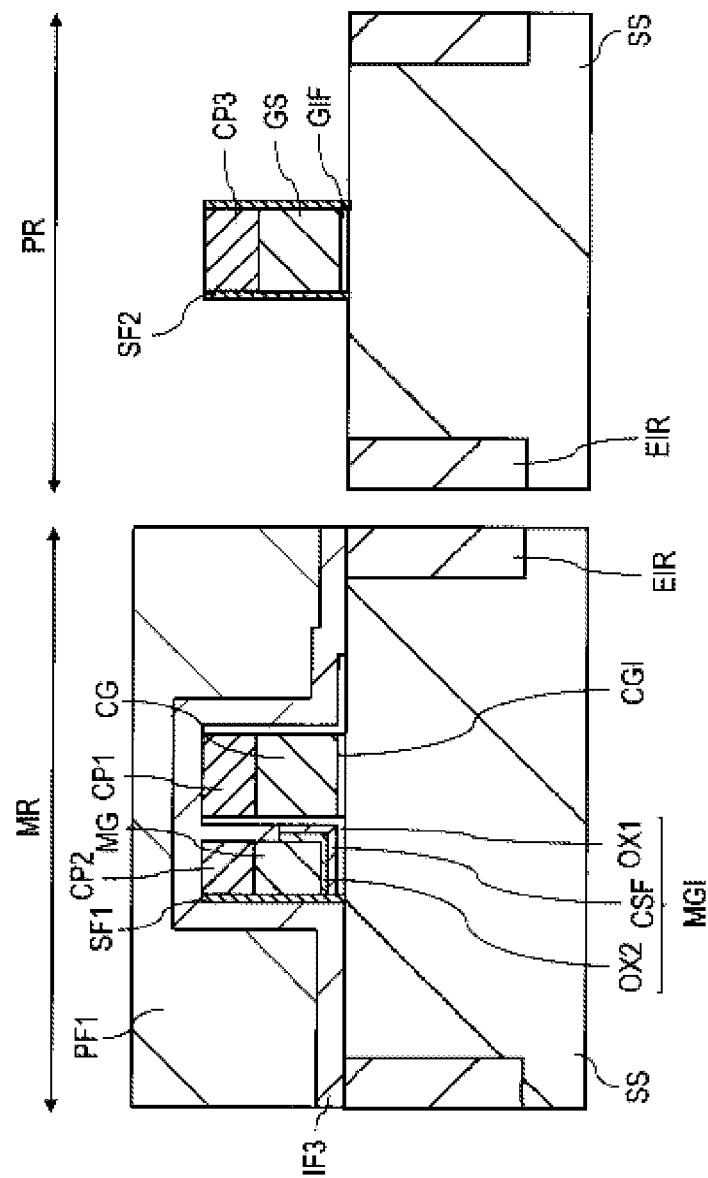
FIG. 17 is a cross-sectional view of a main portion during the manufacturing process of a semiconductor device following FIG. 16.

Next, as shown in FIG. 17, on both side surfaces of the gate structure GS, a spacer film SF2 is formed. The method of forming the spacer film SF2 is the same as the method of forming the spacer film SF1.

Figure 18:
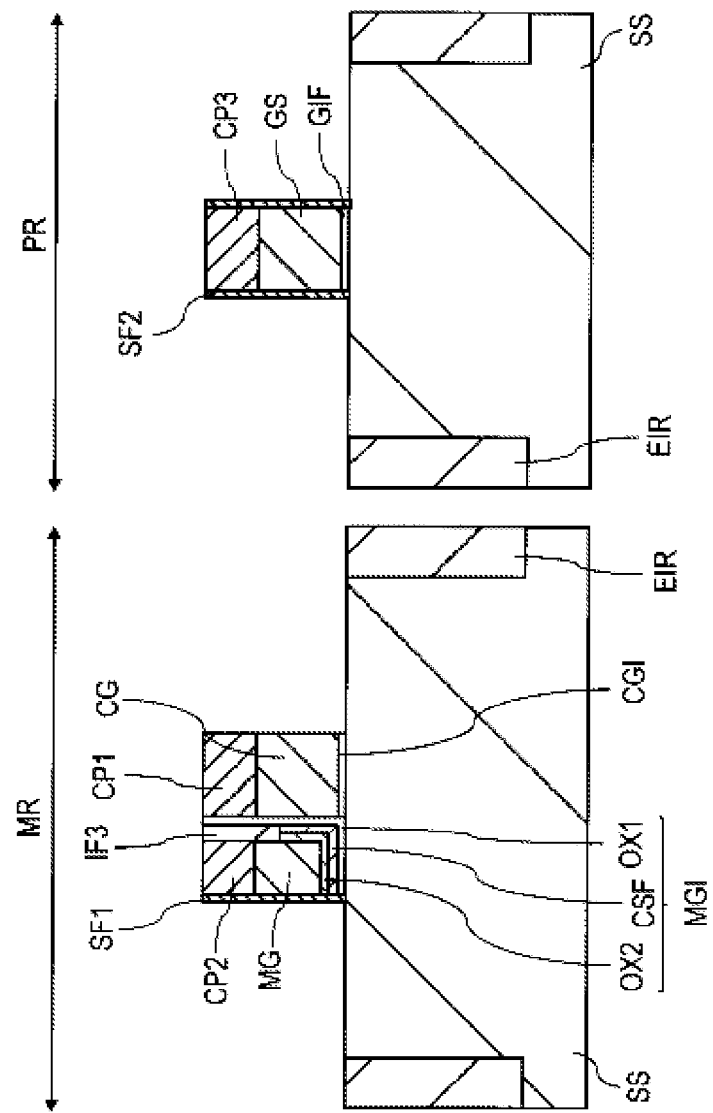
FIG. 18 is a cross-sectional view of a main portion during the manufacturing process of a semiconductor device following FIG. 17.

Next, as shown in FIG. 18, the protective film PF1 and a part of the insulating film IF3 are removed. By providing an isotropic etching to the protective film PF1 and the insulating film IF3, the protective film PF1 and a part of the insulating film IF3 are removed. Although the insulating film IF3 formed outside the trench TR1 is removed, the insulating film IF3 formed in the trench TR1 remains without being removed. During this etching, the insulating film OX2 formed on the side opposite to the memory gate electrode MG side of the control gate electrode CG is also removed.

Figure 19:
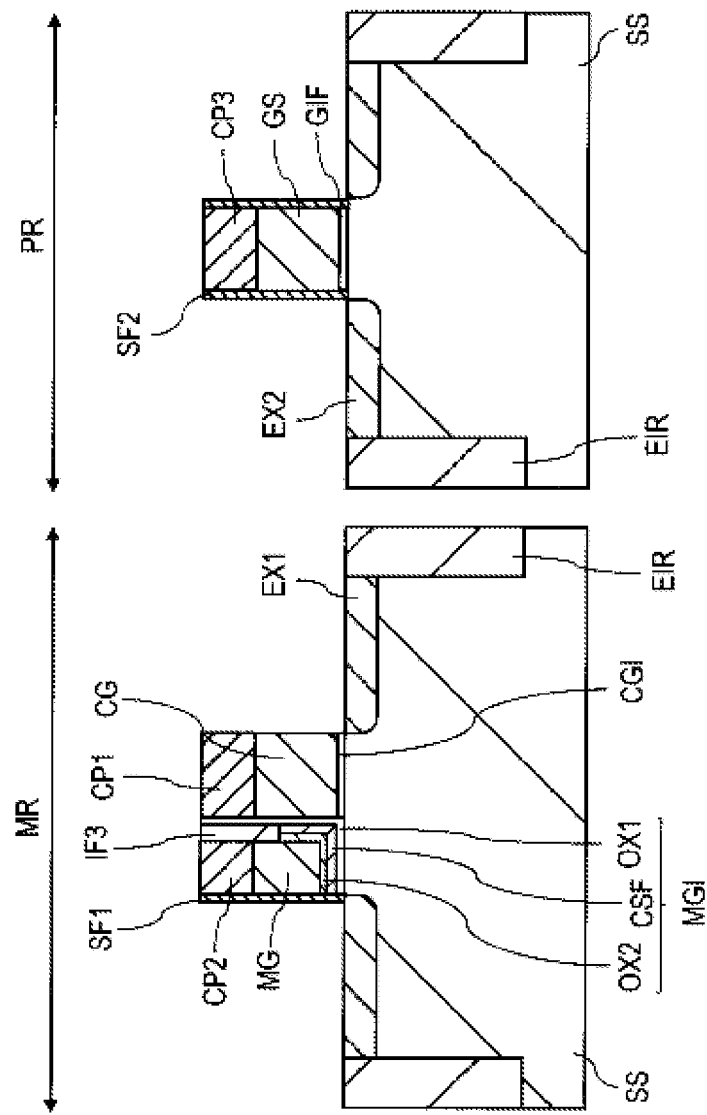
FIG. 19 is a cross-sectional view of a main portion during the manufacturing process of a semiconductor device following FIG. 18.

Next, as shown in FIG. 19, in the memory cell region MR, a n− type semiconductor region EX1 is formed in the semiconductor substrate SS, and in the peripheral region PR, a n− type semiconductor region EX2 is formed in the semiconductor substrate SS.

The n− type semiconductor regions EX1, EX2 are formed by ion-implanting n-type impurities such as phosphorus (P) or arsenic (As) into the semiconductor substrate SS. The n− type semiconductor region EX1 is formed in a self-aligned manner in a region adjacent to the control gate electrode CG and in a region adjacent to the memory gate electrode MG in the semiconductor substrate SS in a plain view. The n− type semiconductor region EX2 is formed in a self-aligned manner in a region of the semiconductor substrate SS adjacent to the gate structure GS.

Figure 20:
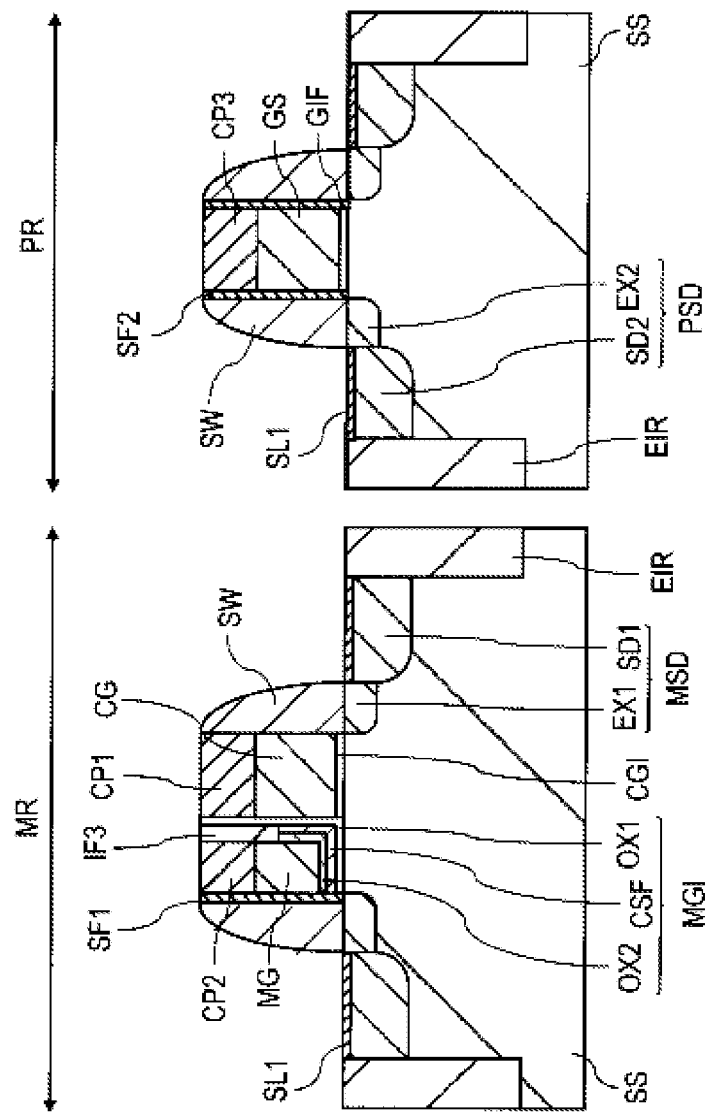
FIG. 20 is a cross-sectional view of a main portion during the manufacturing process of a semiconductor device following FIG. 19.

Next, as shown in FIG. 20, a sidewall spacer SW is formed on the side surface of the control gate electrode CG, on the side surface of the memory gate electrode MG and the side surface of the gate structure GS. The sidewall spacer SW is formed using known insulating film forming methods and etching techniques. Subsequently, in the memory cell region MR, a n⁺ type semiconductor region SD1 is formed in the semiconductor substrate SS and in the peripheral region PR, a n⁺ type semiconductor region SD2 is formed in the semiconductor substrate SS.

The n+ type semiconductor regions SD1, SD2 are formed by ion-implanting n-type impurities such as phosphorus (P) or arsenic (As) into the semiconductor substrate SS. In a plain view, the n⁺ type semiconductor region SD1 is formed in a self-aligned manner in a region of the semiconductor substrate SS adjacent to the sidewall spacer SW in the memory cell region MR. In a plain view, the n⁺ type semiconductor region SD2 is formed in a self-aligned manner in a region of the semiconductor substrate SS adjacent to the sidewall spacer SW in the peripheral region PR.

The n⁻ type semiconductor region EX1 and the n⁺ type semiconductor region SD1 constitute an-type semiconductor region MSD for a memory cell. The n− type semiconductor region EX2 and the n⁺ type semiconductor region SD2 constitute a n− type semiconductor region PSD for MISFET. The n+ type semiconductor regions SD1, SD2 have higher impute density and deeper junction depth than the n⁻ type semiconductor regions EX1, EX2. Thereafter, a heat treatment is performed to activate the impurities introduced into the semiconductor regions MSD and PSD.

Next, a silicide layer SL1 is formed at the upper portion of the n+ type semiconductor regions SD1, SD2. The silicide layer SL1 is formed by known silicide-forming techniques.

Figure 21:
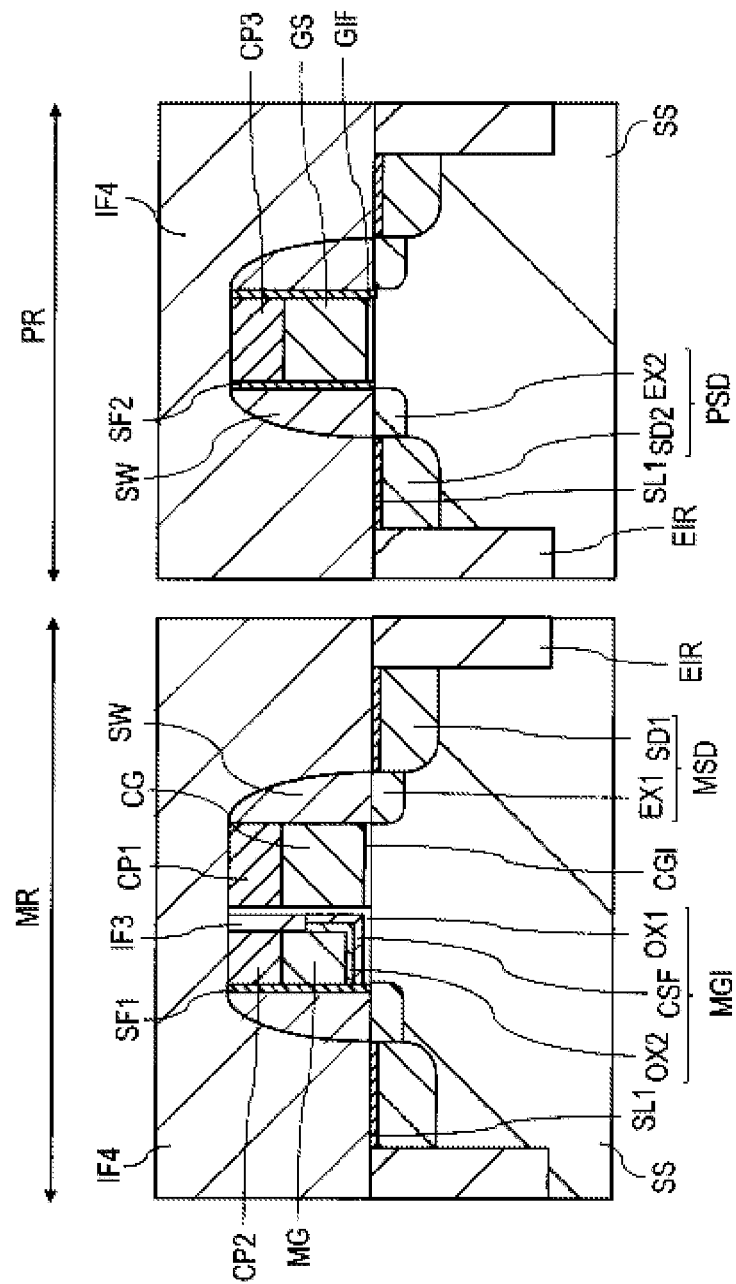
FIG. 21 is a cross-sectional view of a main portion during the manufacturing process of a semiconductor device following FIG. 20.

Next, as shown in FIG. 21, an insulating film IF4 is formed on the semiconductor substrate SS. The insulating film IF4 is formed so as to cover the control gate electrode CG, the memory gate electrode MG and the gate structure GS. The insulating film IF4 is a silicon oxide film. The insulating film IF4 is formed by a CVD method.

Figure 22:
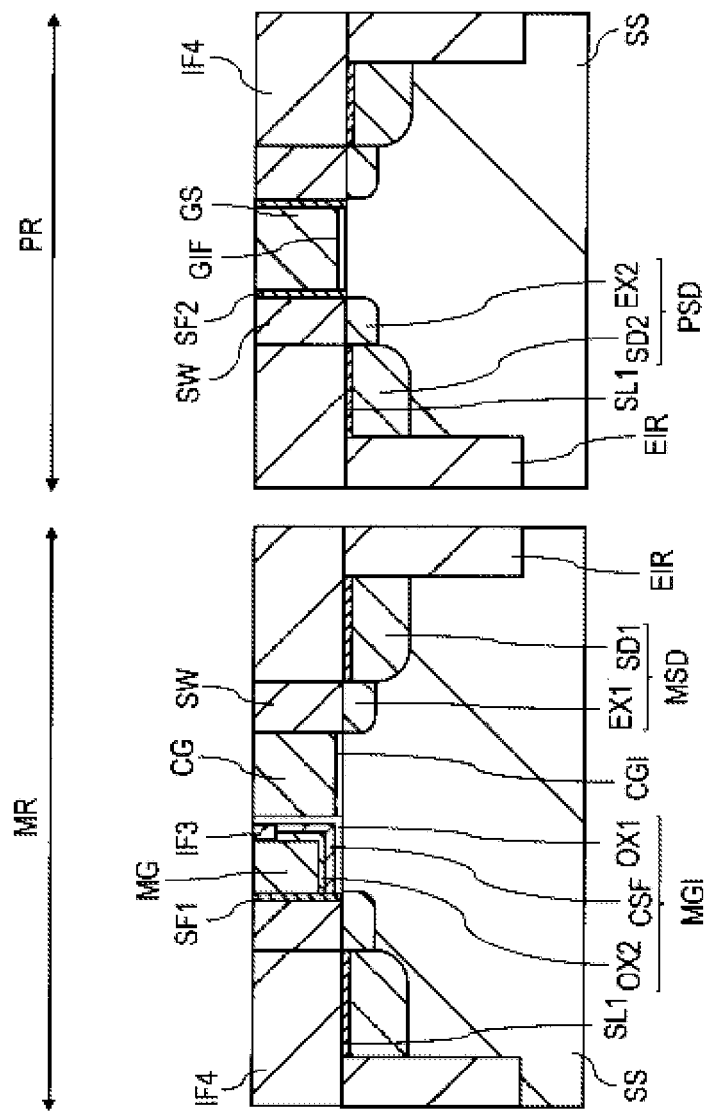
FIG. 22 is a cross-sectional view of a main portion during the manufacturing process of a semiconductor device following FIG. 21.

Next, as shown in FIG. 22, the respective upper surface of the control gate electrode CG, the memory gate electrode MG and the gate structure GS is exposed. By polishing the insulating film IF4 by a CMP (Chemical Mechanical Polishing) method, each upper surface of the cap-insulating films CP1, CP2, CP3 is exposed from the insulating film IF4. Subsequently, by polishing the insulating film IF4 and the cap-insulating films CP1, CP2, CP3 by a CMP method, each upper surface of the control gate electrode CG, the memory gate electrode MG and the gate structure GS is exposed.

The insulating film IF3 formed between the cap-insulating film CP1 and the cap-insulating film CP2 is also polished by a CMP method. The upper surface of each of the insulating film OX2 and the charge accumulation film CSF located between the control gate electrode CG and the memory gate electrode MG is lower than the respective upper surface of the control gate electrode CG and the memory gate electrode MG. That is, the lower surface of the insulating film IF3 located between the control gate electrode CG and the memory gate electrode MG is lower than the respective upper surface of the control gate electrode CG and the memory gate electrode MG. Therefore, when the respective upper surface of the control gate electrode CG and the memory gate electrode MG is exposed, the respective upper surface of the insulating film OX2 and the charge accumulation film CSF is not exposed and is covered with the insulating film IF3.

Figure 23:
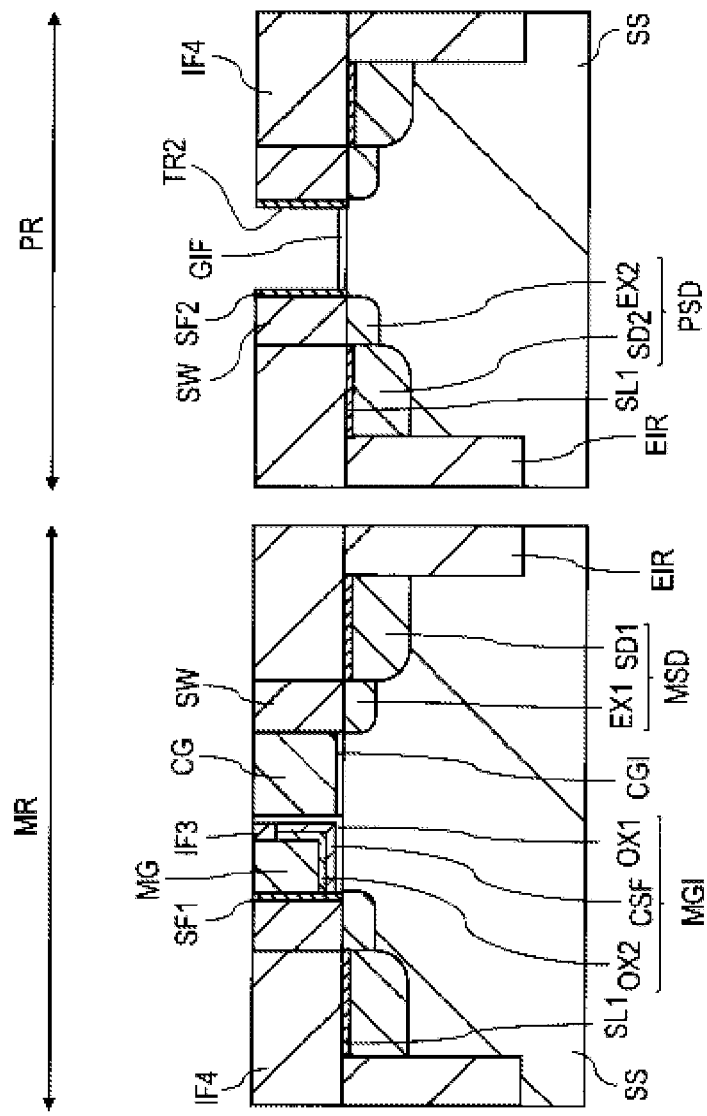
FIG. 23 is a cross-sectional view of a main portion during the manufacturing process of a semiconductor device following FIG. 22.

Next, as shown in FIG. 23, the gate structure GS is removed. The gate structure GS is removed, for example, by an anisotropic etching or an isotropic etching and the like. Thus, a trench TR2 is formed on the gate insulating film GIF. The bottom surface of the trench TR2 is the upper surface of the gate insulating film GIF. The two side surfaces of the trench TR2 are the side surfaces of the spacer film SF2.

Figure 24:
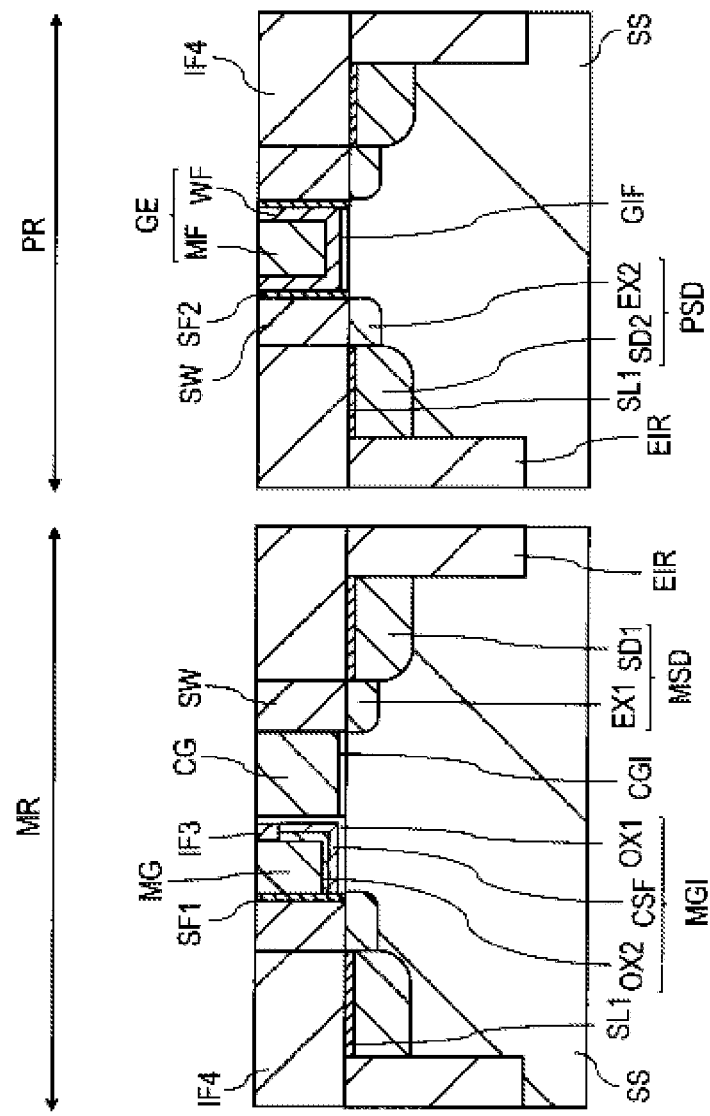
FIG. 24 is a cross-sectional view of a main portion during the manufacturing process of a semiconductor device following FIG. 23.

Next, as shown in FIG. 24, the gate electrode GE is formed in the trench TR2. The gate electrode GE is formed using known sputtering techniques and CMP methods. The gate electrode GE is a laminated film consisting of a metal film WF and a metal film MF. The metal film WF is, for example, a titanium nitride film. The metal film MF is, for example, an aluminum film.

Figure 25:
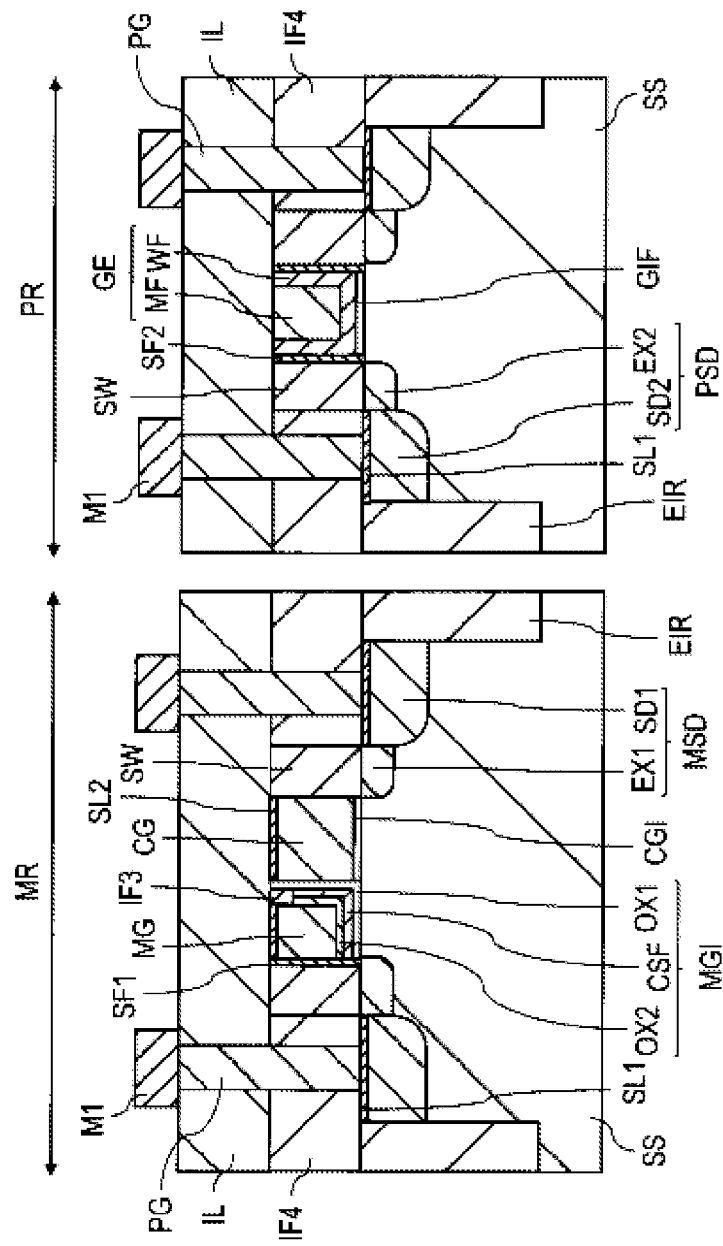
FIG. 25 is a cross-sectional view of a main portion during the manufacturing process of a semiconductor device following FIG. 24.

Next, a silicide layer SL2 is formed on an upper surface of the control gate electrode CG and the memory gate electrode MG, respectively, as shown in FIG. 25. Thereafter, an interlayer insulating film IL, a contact plug PG and a wire M1 are formed on the semiconductor substrate SS. These are formed by using known insulating film forming methods, metal film forming methods, and etching techniques.

As described above, semiconductor device of present embodiment is manufactured.

Main Features and Effects of Method for Manufacturing Semiconductor Device

Next, the main features and effects of the methods for manufacturing a semiconductor device will be described.

One of the main features of the methods for manufacturing a semiconductor device is to retract an upper surface of each of the insulating film OX2 and the charge accumulation film CSF located between the control gate electrode CG and the memory gate electrode MG and to form the insulating film IF3 in the trench (see FIGS. 11 to 13).

In the present embodiment, as shown in FIG. 12, an upper surface of each of the insulating film OX2 and the charge accumulation film CSF located between the control gate electrode CG and the memory gate electrode MG is retracted to form the trench TR1 between the control gate electrode CG and the memory gate electrode MG. Thereafter, the insulating film IF3 is formed in the trench TR1. Thus, as shown in FIG. 13, between the control gate electrode CG and the memory gate electrode MG, the respective upper surface of the charge accumulation film CSF and the insulating film OX2 is covered with the insulating film IF3. Thus, even if the respective upper surface of the control gate electrode CG, the memory gate electrode MG and the gate structure GS is exposed, as shown in FIG. 13, the respective upper surface of the charge accumulation film CSF and the insulating film OX2 is not exposed. That is, when the insulating film IF4 is polished by a CMP method, the charge accumulation film CSF and the insulating film OX2 are not polished. Therefore, when polishing the insulating film IF4, it is possible to prevent the metal contained in the charge accumulation film CSF or the insulating film OX2 or the like from diffusing into the semiconductor substrate SS by polishing the charge accumulation film CSF or the insulating film OX2 or the like. Thus, a threshold variation of MISFET or an increase of a junction leakage current can be suppressed.

Further, another one of the main features of the methods for manufacturing a semiconductor device is to form the spacer film SF1 on a side surface of the gate insulating film MGI located between the memory gate electrode MG and the semiconductor substrate SS (see FIG. 10).

In the present embodiment, as shown in FIG. 10, the spacer film SF1 is formed on a side surface of the gate insulating film MGI located between the memory gate electrode MG and the semiconductor substrate SS. Thus, the side surface of the gate insulating film MGI located between the memory gate electrode MG and the semiconductor substrate SS is covered by the spacer film SF1. If the side surface of the gate insulating film MGI is exposed, the metal contained in the charge accumulation film CSF, the insulating film OX2, or the like may be dissolved in a cleaning solution used in the cleaning process, during the cleaning process after the conductive film CF2 is patterned. The metal dissolved in the cleaning solution diffuse into the semiconductor substrate SS and adhere to the main surface of the semiconductor substrate SS. As a result, a threshold variation of MISFET or the like may occur. By covering the side surface of the gate insulating film MGI with the spacer film SF1, the metal contained in the charge accumulation film CSF, the insulating film OX2, or the like can be prevented from dissolving into the cleaning solution. Therefore, it is possible to prevent the metal contained in the charge accumulation film CSF or the insulating film OX2 or the like from diffusing into the semiconductor substrate SS more reliably. Thus, it is possible to suppress a threshold variation of MISFET or an increase of a junction leakage current or the like.

Since the spacer film SF1 is a silicon nitride film, oxygen generated during the manufacturing process can be prevented from entering the insulating film OX2, the charge accumulation film CSF, or the like. As a result, it is possible to prevent a reliability of the insulating film OX2 or the charge accumulation film CSF from deterioration.

Structure of Semiconductor Device

Next, a structure of the semiconductor device of the present embodiment will be described with reference to the drawings.

As shown in FIG. 25, a memory cell is formed in the memory cell region MR of the semiconductor substrate SS, and a MISFET is formed in the peripheral region PR of the semiconductor substrate SS. A plurality of memory cells and a plurality of MISFETs are formed on the semiconductor substrate SS.

The memory cell in the present embodiment has the control gate electrode CG, the memory gate electrode MG, the gate insulating film CGI, MGI, the semiconductor region MSD and the sidewall spacer SW. The memory cell is formed by connecting a control transistor having the control gate electrode CG and a memory transistor having the memory gate electrode MG.

The control gate electrode CG is formed on the semiconductor substrate SS through the gate insulating film CGI. The control gate electrode CG extends along the main surface of the semiconductor substrate SS and are arranged side by side. The extending direction of the control gate electrode CG is a direction perpendicular to the paper surface of FIG. 25. The control gate electrode CG is arranged side by side along the main surface of the semiconductor substrate SS and in a direction substantially perpendicular to the direction in which the control gate electrode CG extends. On an upper surface of the control gate electrode CG, the silicide layer SL2 is formed. The control gate electrode CG and the memory gate electrode MG are adjacent to each other through the gate insulating film MGI.

The memory gate electrode MG is formed on the semiconductor substrate SS through the gate insulating film MGI. The memory gate electrode MG extends along the main surface of the semiconductor substrate SS and is arranged side by side. The extending direction of the memory gate electrode MG is a direction perpendicular to the paper surface of FIG. 25. The memory gate electrode MG is arranged side by side along the main surface of the semiconductor substrate SS and in a direction substantially perpendicular to the direction in which the memory gate electrode MG extends. The silicide layer SL2 is formed on an upper surface of the memory gate electrodes MG. The memory gate electrode MG and the control gate electrode CG are adjacent to each other through the gate insulating film MGI.

The gate insulating film CGI is formed between the semiconductor substrate SS and the control gate electrode CG. The gate insulating film CGI functions as a gate insulating film of the control transistor. In the semiconductor substrate SS, the region in contact with the gate insulating film CGI is a channel region of the control transistor.

The gate insulating film MGI is formed between the semiconductor substrate SS and the memory gate electrode MG, and between the control gate electrode CG and the memory gate electrode MG. The gate insulator MGI functions as a gate insulator for memory transistors. In the semiconductor substrate SS, the region in contact with the gate insulating film MGI is a channel region of the memory transistor. The channel region of the control transistor and the channel region of the memory transistor constitute a channel region of the memory cell.

The charge accumulation film CSF constituting the gate insulating film MGI is a film for accumulating charges. That is, the charge accumulation film CSF is a trapping insulating film formed in the gate insulating film MGI. Further, the insulating films OX1, OX2 constituting the gate insulating film MGI function as a charge-block layer or a charge-confinement layer. Since the charge accumulation film CSF is sandwiched between the insulating films OX1, OX2, charges can be accumulated in the charge accumulation film CSF.

Between the control gate electrode CG and the memory gate electrode MG, the respective upper surface of the charge accumulation film CSF and the insulating film OX2 is lower than the respective upper surface of the control gate electrode CG and the memory gate electrode MG. In other words, between the control gate electrode CG and the memory gate electrode MG, an upper surface of a portion of the gate insulating film MGI is lower than the respective upper surface of the control gate electrode CG and the memory gate electrode MG. The insulating film IF3 is formed on the charge accumulation film CSF and the insulating film OX2. The respective upper surface of the charge accumulation film CSF and the insulating film OX2 is covered with the insulating film IF3.

The semiconductor region MSD is formed in a region adjacent to the control gate electrode CG and a region adjacent to the memory gate electrode MG in the semiconductor substrate SS in a plain view. The semiconductor region MSD is a semiconductor region for a source and a drain of a memory cell. In the semiconductor region MSD, the source region and the drain region are interchanged depending on the operation of the memory cell. A semiconductor region formed in the semiconductor substrate SS in the side of the memory gate electrode MG is defined as a source region, and a semiconductor region formed in the semiconductor substrate SS in the side of the control gate electrode CG is defined as a drain region.

The sidewall spacer SW is formed on the semiconductor substrate SS so as to sandwich the control gate electrode CG and the memory gate electrode MG. The spacer film SF1 is formed between the memory gate electrode MG and the sidewall spacer SW.

MISFET in the present embodiment has a gate electrode GE, a gate insulating film GIF, a semiconductor region PSD and a sidewall spacer SW.

The gate electrode GE extends along the main surface of the semiconductor substrate SS and is arranged side by side, similar to the control gate electrode CG and the memory gate electrode MG.

The gate insulating film GIF is formed between the semiconductor substrate SS and the gate electrode GE. In the semiconductor substrate SS, the region in contact with the gate insulating film GIF is a channel region of MISFET.

The semiconductor region PSD, in a plain view, is formed in a region adjacent to the gate electrode GE in the semiconductor substrate SS. The semiconductor region PSD is a semiconductor region for a source and a drain of MISFET.

The sidewall spacer SW is formed on the semiconductor substrate SS so as to sandwich the gate electrode GE. Between the gate electrode GE and the sidewall spacer SW, the spacer film SF2 is formed.

Main Features and Effects of Structure of Semiconductor Device

The main features and effects of the construction of the semiconductor device will now be described.

One of the main features of the structure of semiconductor device is that the insulating film IF3 is formed between the control gate electrode CG and the memory gate electrode MG on the charge accumulation film CSF and on the insulating film OX2 (see FIG. 25).

In the present embodiment, the respective upper surface of the charge accumulation film CSF and the insulating film OX2 located between the control gate electrode CG and the memory gate electrode MG is lower than the respective upper surface of the control gate electrode CG and the memory gate electrode MG. The insulating film IF3 is formed on the charge accumulation film CSF and the insulating film OX2. The charge accumulation film CSF and the insulating film OX2 are films having the dielectric constant higher than a silicon nitride film. The dielectric constant of the insulating film IF3 is smaller than the respective dielectric constant of the charge accumulation film CSF and the insulating film OX2. Therefore, in the portion where the insulating film IF3 is formed, it is possible to improve a withstand voltage between the control gate electrode CG and the memory gate electrode MG. The insulating film IF3 can reduce a leakage current between the silicide layers SL2.

Operation of Memory Cell

Next, an example of an operation of the memory cell will be described with reference to FIG. 26.

FIG. 26 is a table showing an example of voltages applied to the respective portions of the selected memory cell in a write operation, an erase operation, and a read operation of the memory cell according to the present embodiment. In the table of FIG. 26, a voltage Vmg applied to the memory gate electrode MG, a voltage Vs applied to the source region, a voltage Vcg applied to the control gate electrode CG, a voltage Vd applied to the drain region and a voltage Vb applied to the semiconductor substrate SS in each of the write operation, the erase operation and the read operation are described. In the present embodiment, injection of electrons into the charge accumulation film CSF in the gate insulating film MGI of the memory transistor is defined as "write" and injection of holes into the charge accumulation film CSF is defined as "erase".

As a writing method, a writing method (hot electron injection writing method) in which a writing is performed by hot electron injection by source side injection is used. This writing method is called an SSI (Source Side Injection) scheme. The voltage shown in the write column of FIG. 26 is applied to each portion of the selected memory cell where the write operation is performed. Thus, a writing is performed by injecting electrons into the charge accumulation film CSF of the gate insulating film MGI of the selected memory cell. Hot electrons are generated in the channel region (between the source and drain) located between the control gate electrode CG and the memory gate electrode MG in a plain view, and are injected into the charge accumulation film CSF under the memory gate electrode MG. The injected hot electrons are captured at a trap level in the charge accumulation film CSF. As a result, a threshold voltage of the memory transistor is increased. The memory transistor is in a write state.

As an erasing method, an erasing method in which an erasing is performed by hot hole injection (hot hole injection erasing method) is used. An erasing is performed by injecting holes generated by BTBT (Band-To-Band Tunneling; tunnel phenomena between bands) into the charge accumulation film CSF. This erasing method is called a BTBT method. The voltage shown in the erase column of FIG. 26 is applied to each portion of the selected memory cell where the erase operation is performed. As a result, holes generated by BTBT phenomena are accelerated by an electric field to inject holes into the charge accumulation film CSF of the selected memory cells. This lowers a threshold voltage of the memory transistor. The memory transistor is in an erase state.

At the time of reading, for example, the voltage shown in the read column of FIG. 26 is applied to each portion of the selected memory cell where the reading operation is performed. The voltage Vmg applied to the memory gate electrode MG at the time of reading is set to a value between the threshold voltage of the memory transistor in the write state and the threshold voltage of the memory transistor in the erase state. Thus, it is determined whether the selected memory cell is in a write state or an erase state.

First Alternative Example

Figure 27:
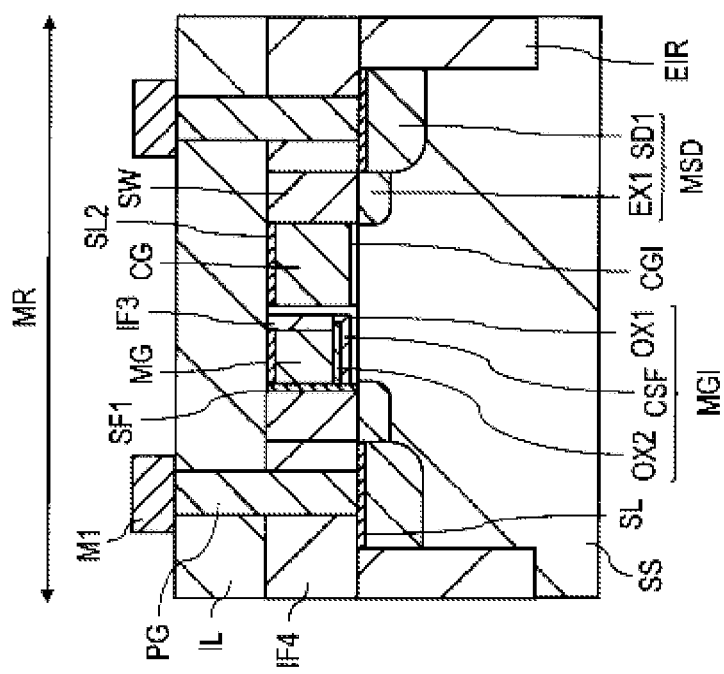
FIG. 27 is a cross-sectional view of a main portion of a semiconductor device according to a first alternative example of the first embodiment.

FIG. 27 is a cross-sectional view of a main portion of the semiconductor device according to the first alternative example of the first embodiment. FIG. 27 shows a cross-sectional view of a main portion in the memory cell region MR. Hereinafter, portions differing from the first embodiment will be described.

In the process shown in FIG. 12, the insulating film OX2 and the charge accumulation film CSF are removed until a bottom surface of the trench TR1 touches a bottom surface of the memory gate electrode MG. At this time, if the charge accumulation film CSF located between the memory gate electrode MG and the semiconductor substrate SS is not removed, the bottom surface of the trench TR1 may be positioned at the side of the semiconductor substrate SS rather than the bottom surface of the memory gate electrode MG. Next, in the process shown in FIG. 13, the insulating film IF3 is formed in the trench TR1. Between the control gate electrode CG and the memory gate electrode MG, a bottom surface of the insulating film IF3 is in contact with a bottom surface of the memory gate electrode MG. That is, the bottom surface of the insulating film IF3 and the bottom surface of the memory gate electrode MG are continuous. Thereafter, the same process as the first embodiment is performed. As a result, as shown in FIG. 27, the semiconductor device according to the first alternative example is obtained.

In the first alternative example, the bottom surface of the insulating film IF3 is in contact with the bottom surface of the memory gate electrode MG. That is, between the control gate electrode CG and the memory gate electrode MG, the charge accumulation film CSF is not formed above the bottom surface of the memory gate electrode MG. The charge injected from the semiconductor substrate SS into the charge accumulation film CSF does not diffuse above the bottom surface of the memory gate electrode MG through the charge accumulation film CSF. As a result, a deterioration of the charge retention characteristic of the memory cell can be suppressed.

Second Alternative Example

Figure 28:
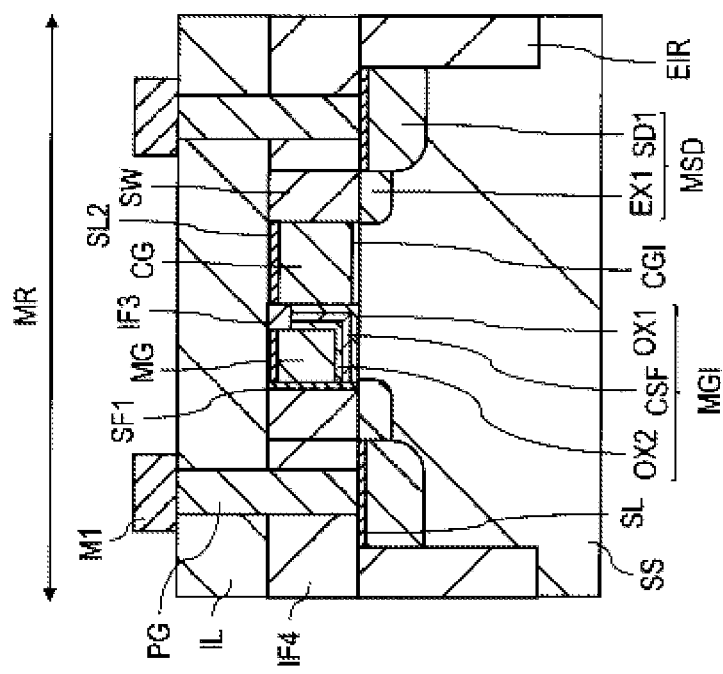
FIG. 28 is a cross-sectional view of a main portion of a semiconductor device according to a second alternative example of the first embodiment.

FIG. 28 is a cross-sectional view of a main portion of the semiconductor device according to the second alternative example of the first embodiment. FIG. 28 shows a cross-sectional view of a main portion in the memory cell region MR of the semiconductor substrate SS. Hereinafter, portions differing from the first embodiment will be described.

In the process shown in FIG. 4, the insulating film OX1 formed on the semiconductor substrate SS is an insulating film containing a metal other than silicon. Methods and materials for forming the insulating film OX1 are the same as those of the insulating film OX2. Thereafter, in the process shown in FIG. 12, the insulating film OX2, the charge accumulation film CSF, and the insulating film OX1 are removed to form a trench TR1. That is, by removing a portion of the gate insulating film MGI, the trench TR1 is formed. Next, in the process shown in FIG. 13, the insulating film IF3 is formed in the trench TR1 so as to cover an upper surface of the insulating film OX2, the charge accumulation film CSF, and the insulating film OX1. Thereafter, the same process as the first embodiment is performed. As a result, as shown in FIG. 28, the semiconductor device according to the second alternative example is obtained.

In the first embodiment, the insulating film OX1 is a silicon oxide film. As in the present second alternative example, even if the insulating film OX1 is a film containing a metal other than silicon, the same effects as those of the first embodiment can be obtained by covering the insulating film OX1 with the insulating film IF3. A leakage current between the memory gate electrode MG and the semiconductor substrate SS can be reduced by the fact that the insulating film OX1 is a film containing a metal other than silicon.

Third Alternative Example

The semiconductor device related to the third alternative example of the first embodiment will be explained. In the first embodiment, a case where the spacer film SF1 is a silicon nitride film is described. The third alternative example differs from the first embodiment in that the spacer film SF1 is a silicon oxide film. The cross-sectional configuration of the third alternative example is the same as that of the first embodiment, and therefore, illustration thereof is omitted.

A silicon nitride film has a property of holding electric charge. During a write operation or an erase operation, etc., charges may be injected not only into the charge accumulation film CSF but also into the spacer film SF1, which is a silicon nitride film. The charges injected into the spacer film SF1 may cause a decrease in the writing speed or the erasing speed. Since the spacer film SF1 is a silicon oxide film, charges are not injected into the spacer film SF1. As a result, a decrease in the writing speed or the erasing speed is prevented. The spacer film SF1 in the third alternative example is formed in the same manner as in the first embodiment.

Fourth Alternative Example

Figure 29:
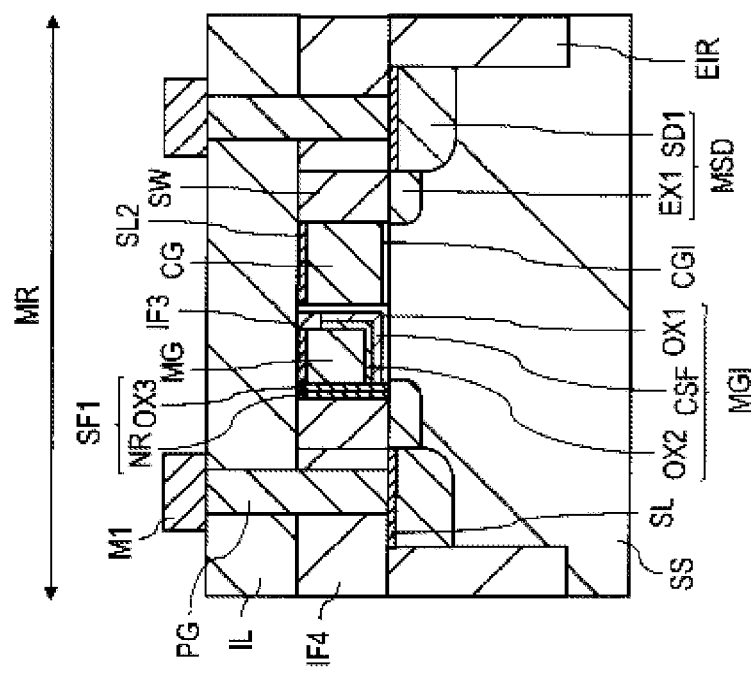
FIG. 29 is a cross-sectional view of a main portion of a semiconductor device according to a fourth alternative example of the first embodiment.

FIG. 29 is a cross-sectional view of a main portion of the semiconductor device according to the fourth alternative example of the first embodiment. FIG. 29 shows a cross-sectional view of a main portion in the memory cell region MR of the semiconductor substrate SS. Hereinafter, portions differing from the first embodiment will be described.

In the process shown in FIG. 10, the silicon oxide film OX3 is formed on a side surface of the memory gate electrode MG. Next, on the side surface of the silicon oxide film OX3, a silicon nitride film NR is formed. Thereafter, the same process as the first embodiment is performed. Thus, as shown in FIG. 29, the semiconductor device according to the fourth alternative example is obtained.

In the fourth alternative example, the spacer film SF1 is a laminated film of the silicon oxide film OX3 and the silicon nitride film NR. As a result, it is possible to prevent oxygen from entering the charge accumulation film CSF and the insulating film OX2 while suppressing charges from being injected into the spacer film SF1.

Fifth Alternative Example

The semiconductor device related to the fifth alternative example of the first embodiment will be explained. In the first embodiment, the insulating film IF3 is a silicon oxide film. The fifth alternative example differs from the first embodiment in that the insulating film IF3 is a silicon nitride film. The cross-sectional configuration of the fifth alternative example is the same as that of the first embodiment, and therefore, illustration thereof is omitted. Since the insulating film IF3 is a silicon nitride film, oxygen is prevented from entering the insulating film OX2 and the charge accumulation film CSF located between the control gate electrode CG and the memory gate electrode MG.

Second Embodiment

Structure of Semiconductor Device

Figure 30:
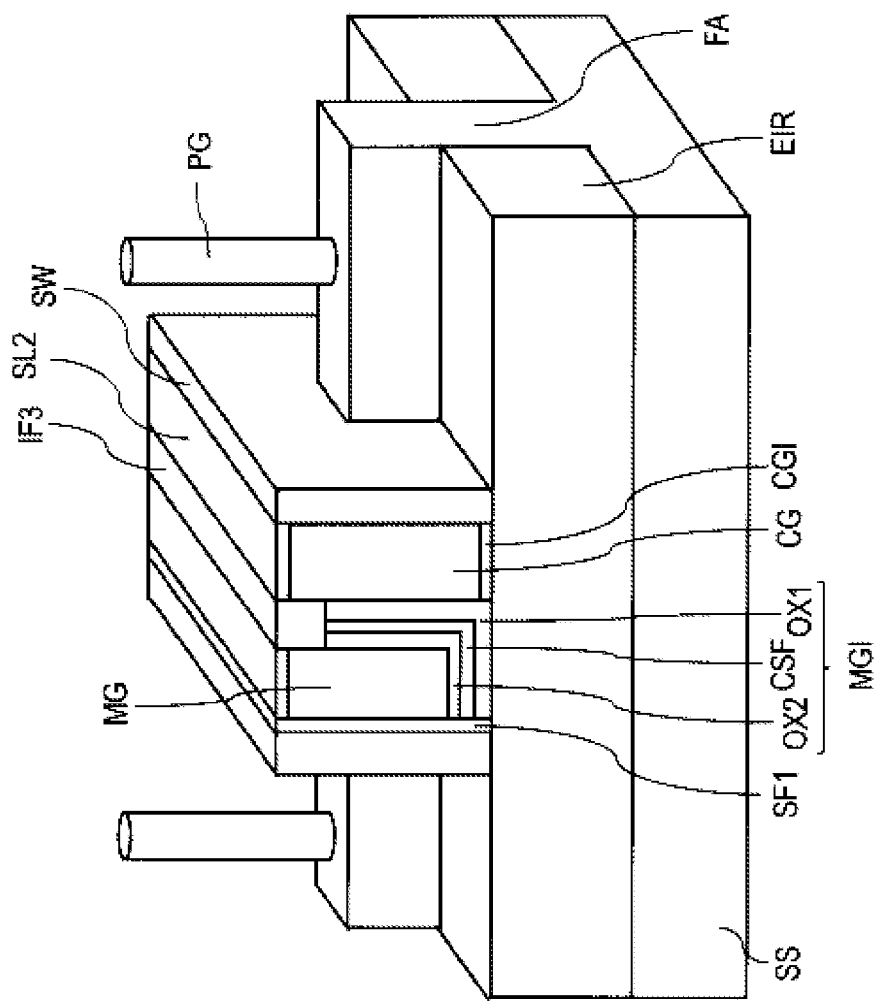
FIG. 30 is a perspective view of a main portion of a semiconductor device according to a second embodiment.

FIG. 30 is a perspective view of a main portion of the semiconductor device according to the present embodiment. In FIG. 30, an illustration of a wiring M1, an interlayer insulating film IL, an insulating film IF4 and a semiconductor region MSD is omitted. The semiconductor device according to the present embodiment has a protrusion portion FA, a control gate electrode CG, a memory gate electrode MG, gate insulating films CGI, MGI, a semiconductor region MSD and a sidewall spacer SW. MISFET may also be formed on a protrusion consisting of a part of the semiconductor substrate SS, but illustration and description thereof are omitted.

The protruding portion FA consists of a part of the semiconductor substrate SS and protrudes from a main surface of the semiconductor substrate SS. In the second embodiment, a main surface of the semiconductor substrate SS is an upper surface of the semiconductor substrate SS located between the protrusion portions FA adjacent to each other. The protrusion portion FA extends in a first direction along the main surface of the semiconductor substrate SS. The protruding portions FA are arranged so as to intersect substantially perpendicular to the first direction and are arranged in a plurality side by side in a second direction along the main surface of the semiconductor substrate SS. The protrusion portion FA has a width in the second direction. In the second direction, an element isolation region EIR is formed between the projection portions FA adjacent to each other. The protrusion portion FA protrudes from an upper surface of the element isolation region EIR. That is, in a direction perpendicular to the main surface of the semiconductor substrate SS, an interval between an upper surface of the protrusion portion FA and the main surface of the semiconductor substrate SS is greater than the interval between an upper surface of the element isolation region EIR and the main surface of the semiconductor substrate SS.

Each of the control gate electrode CG, the memory gate electrode MG, the gate insulating films CGI, MGI and the sidewall spacer SW is formed on an upper surface and a side surface of the protrusion portion FA.

The semiconductor region MSD is formed in the protrusion portion FA. In a plain view, the semiconductor region MSD is formed in a region adjacent to the control gate electrode CG and a region adjacent to the memory gate electrode MG in the protrusion portion FA.

Method for Manufacturing Semiconductor Device

Next, a method for manufacturing the semiconductor device related to the second embodiment will be described. The illustration of a method for manufacturing of the present embodiment is omitted. Descriptions overlapping with those of the first embodiment are omitted.

Prior to forming the element isolation region EIR in the semiconductor substrate SS, the protrusion portion FA consisting of a part of semiconductor substrate SS is formed. The protrusion portion FA is formed by applying an anisotropic etching to the semiconductor substrate SS and removing a part of the semiconductor substrate SS while a patterned mask is formed on an upper surface of the semiconductor substrate SS. Thereafter, the element isolation region EIR is formed on the semiconductor substrate SS.

Thereafter, the processes shown in FIGS. 2 to 25 are performed. The processes shown in FIGS. 2-25 are performed on the semiconductor substrate SS having the protrusion portion FA. Each of the control gate electrode CG, the memory gate electrode MG, the gate insulating films CGI, MGI, and the sidewall spacer SW is formed on an upper surface and a side surface of the protrusion portion FA. The semiconductor region MSD, in plain view, is formed in a region adjacent to the control gate electrode CG and in a region adjacent to the memory gate electrode MG in the protrusion portion FA. As a result, as shown in FIG. 30, the semiconductor device according to the present embodiment is obtained.

Main Features and Effects of Structure of Semiconductor Device

Also, in the present embodiment, the insulating film IF3 is formed so as to cover an upper surface of each of the insulating film OX2 and the charge accumulation film CSF. Therefore, the same effects as the first embodiment can be obtained. Since the memory cells are formed on the protrusion portion FA, the memory cells can run faster than the memory cells of the first embodiment.

Although the invention made by the present inventor has been specifically described based on the embodiments, the present invention is not limited to the embodiments described above, and various modifications can be made without departing from the gist thereof. In addition, at least a part of each embodiment and each alternative example may be arbitrarily combined with each other.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

What is claimed is:

1. A method for manufacturing semiconductor device, comprising:
   (a) forming, on a main surface of a semiconductor substrate, a first gate structure of nonvolatile memory comprising a control gate electrode formed via a first gate insulating film, a memory gate electrode disposed on a side part of the control gate electrode, and a charge accumulation film disposed between the control gate electrode and the memory gate electrode and below the memory gate electrode,
   (b) forming a protective film so as to cover the first gate structure,
   (c) after the (b), forming a MISFET gate structure on the main surface of the semiconductor substrate via a second gate insulating film in a status where the first gate structure is covered with the protective film,
   (d) after the (c), forming a first insulating film so as to cover the first gate structure and the MISFET gate structure,
   (e) after the (d), exposing an upper surface of each of the control gate electrode, the memory gate electrode and the first gate structure by polishing the first insulating film by CMP method, wherein
   the charge accumulation film is formed of an insulating film comprising a first metal different from silicon,
   the (a) further comprises
      forming a trench having a bottom surface at a position lower than the upper surface as exposed of the control gate electrode and the memory gate electrode by etching to remove an upper part of the charge accumulation film disposed between the control gate electrode and the memory gate electrode, and the (b) comprises forming the protective film so as to fill the trench.

2. The method for manufacturing semiconductor device according to claim 1, wherein, the first metal is hafnium.

3. The method for manufacturing semiconductor device according to claim 2, wherein the protective film is a silicon oxide film or a silicon nitride film.

4. The method for manufacturing semiconductor device according to claim 2, further comprising
   (f) prior to the (a), forming a protruding portion formed of a part of the semiconductor device by providing anisotropic etching on the main surface of the semiconductor substrate so to remove a portion of the semiconductor substrate, wherein the first gate structure is formed on an upper surface and a side surface of the protruding portion.

5. The method for manufacturing semiconductor device according to claim 1, wherein the first gate structure comprises, between the memory gate electrode and the charge accumulation film, a first oxide film comprising a second metal different from silicon, the second metal is aluminum, titanium, zirconium, yttrium, lanthanum, praseodymium or lutetium, and the (a) further comprises forming the trench having the bottom surface at the position lower than the upper surface as exposed of the control gate electrode and the memory gate electrode by etching to remove the first insulating film and the charge accumulation film disposed between the control gate electrode and the memory gate electrode.

6. The method for manufacturing semiconductor device according to claim 5, wherein the (a) comprises forming a spacer film on a side surface of the memory gate electrode so as to cover a side surface of the first oxide film and a side surface of the charge accumulation film located between the memory gate electrode and the semiconductor substrate.

7. The method for manufacturing semiconductor device according to claim 6, wherein the spacer film is a silicon nitride film or a silicon oxide film.

8. The method for manufacturing semiconductor device according to claim 6, wherein the spacer film is a laminated film comprising a silicon oxide film in contact with the memory gate electrode and the charge accumulation film and a silicon nitride film formed on the silicon oxide film.

9. The method for manufacturing semiconductor device according to claim 5, wherein in the (a), the bottom surface of the trench is in contact with a bottom surface of the memory gate electrode.

10. The method for manufacturing semiconductor device according to claim 5, wherein the first gate structure comprises, between the control gate electrode and the charge accumulation film and between the charge accumulation film and the semiconductor substrate, a second oxide film comprising a second metal different from the silicon aluminum, the second metal is aluminum, titanium, zirconium, yttrium, lanthanum, praseodymium or lutetium, and the (a) further comprises forming the trench having the bottom surface at the position lower than the upper surface as exposed of the control gate electrode and the memory gate electrode by etching to remove the first oxide film, the second oxide film and the charge accumulation film disposed between the control gate electrode and the memory gate electrode.

\* \* \* \* \*